(12) United States Patent
Emoto

(10) Patent No.: US 8,803,504 B2
(45) Date of Patent: Aug. 12, 2014

(54) METHOD AND DEVICE FOR DIAGNOSING SIGNAL STATUS IN MEASUREMENT, DRIVE, OR CONTROL, AND TRANSFORMER USED IN THE DEVICE

(75) Inventor: Hideaki Emoto, Tokyo (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 386 days.

(21) Appl. No.: 12/674,433

(22) PCT Filed: Jan. 9, 2009

(86) PCT No.: PCT/JP2009/050598
§ 371 (c)(1),
(2), (4) Date: Apr. 26, 2010

(87) PCT Pub. No.: WO2009/088100
PCT Pub. Date: Jul. 16, 2009

(65) Prior Publication Data
US 2011/0215793 A1    Sep. 8, 2011

(30) Foreign Application Priority Data

Jan. 11, 2008  (JP) .................................. 2008-005074

(51) Int. Cl.
*G01R 19/00* (2006.01)
*G01R 31/00* (2006.01)
(52) U.S. Cl.
USPC .................................. 324/76.11; 324/750.01
(58) Field of Classification Search
None
See application file for complete search history.

(56) References Cited

U.S. PATENT DOCUMENTS

| | | | | |
|---|---|---|---|---|
| 2,998,562 A | * | 8/1961 | Bedrich Petzelt | ............. 363/110 |
| 3,065,411 A | * | 11/1962 | Roberts | ......................... 324/468 |
| 5,519,300 A | * | 5/1996 | Leon et al. | .................... 318/729 |
| 5,995,387 A | * | 11/1999 | Takahashi et al. | ......... 363/21.04 |
| 6,456,059 B1 | * | 9/2002 | Blakely | ......................... 324/127 |

(Continued)

FOREIGN PATENT DOCUMENTS

| | | |
|---|---|---|
| CN | 1553562 A | 12/2004 |
| CN | 1574590 A | 2/2005 |

(Continued)

OTHER PUBLICATIONS

Chinese Office Action for CN200980100036.4, dated Jan. 18, 2012.

(Continued)

*Primary Examiner* — Vinh Nguyen
(74) *Attorney, Agent, or Firm* — Benjamin J. Hauptman; Manabu Kanesaka

(57) ABSTRACT

A device for diagnosing signal status includes a transformer, a signal generating unit, a device-to-be-driven, a current measuring unit, and an intermediate tap. The transformer includes a primary coil and a secondary coil. The signal generating unit is arranged for generating an alternating voltage and is connected to the primary coil. The device-to-be-driven is arranged for performing measurement, drive, or control and is connected to the secondary coil. The current measuring unit is arranged for measuring change in the current of the primary coil caused by electric power consumed for an action of the device-to-be-driven. In at least one embodiment, diagnosis of signal status in the measurement, drive, or control by the device-to-be-driven is performed based on the measurement result of said change in current. The intermediate tap is provided to the primary coil and configured to be connected to the current measuring means.

2 Claims, 14 Drawing Sheets

(56) References Cited

U.S. PATENT DOCUMENTS

| | | | |
|---|---|---|---|
| 6,774,618 B2 * | 8/2004 | Blakely | 324/127 |
| 8,253,366 B2 * | 8/2012 | Emoto | 318/490 |
| 2004/0240234 A1 | 12/2004 | Toda et al. | |

FOREIGN PATENT DOCUMENTS

| | | | |
|---|---|---|---|
| JP | 63-204163 | * | 8/1988 |
| JP | 63-204163 A | | 8/1988 |
| JP | 8-5708 A | | 1/1996 |
| JP | 2004-198302 A | | 7/2004 |
| JP | 2006-23105 A | | 1/2006 |

OTHER PUBLICATIONS

English Translation of International Preliminary Report of corresponding Application No. PCT/JP2009/05098 mailed Aug. 19, 2010.

International Search Report of Application No. PCT/JP2009/050598 mailed May 19, 2009.

Notice of allowance effective Jun. 8, 2013, as issued to the corresponding Chinese application No. 200980100036.4.

International Preliminary Report on Patentability—Japanese Language Version (Jan. 11, 2008).

International Preliminary Report on Patentability—English Language Translation (Jan. 11, 2008).

* cited by examiner

METHOD AND DEVICE FOR DIAGNOSING SIGNAL STATUS IN MEASUREMENT, DRIVE, OR CONTROL, AND TRANSFORMER USED IN THE DEVICE

RELATED APPLICATIONS

The present application is based on International Application Number PCT/JP2009/050598, filed Jan. 9, 2009, and claims priority from Japanese Application Number JP2008-005074, filed Jan. 11, 2008, the disclosures of which are hereby incorporated by reference herein in their entirety.

TECHNICAL FIELD

The present invention relates to a method and device for diagnosing signal status in measurement, drive, or control by a measuring means, driving means and controlling means, and a transformer used in the device, particularly those for diagnosing signal status in measurement, drive, or control, in which measurement with a high degree of accuracy by simple circuitry using measurement means such as sensors, transmitters, etc., and control using control means and drive means such as servo valves, relays, actuators including motors.

BACKGROUND ART

There have been known control means and actuating means for measuring, driving, and controlling used for controlling plants and equipment, with which the measurement result is returned in the form of analog signal as shown in the following items (1) to (3).

(1) A sensor such as a transmitter for measurement, which is supplied with electric power and outputs measurement results of temperature, humidity, and pressure converting them into analog signals.

(2) A sensor such as a thermocouple and resistance thermometer bulb, which outputs measurement result as a change of voltage and electric resistance.

(3) A control actuator such as a servo valve which is supplied with electric power and controls valve opening from full open to full close in accordance with imputed voltage signals.

There have also been known control means which return measurement results in binary signals (digital signals) or driven by binary signals as shown in the following items (4) to (6).

(4) A control means having a contact for switching-on and -off upon detecting that pressure or temperature reaches a prescribed value and being utilized for detecting ambient conditions, the means being supplied with electric power.

(5) A control means such as a relay contact or ON/OFF switching means made of semiconductor, which actuates upon receiving a binary signal, i.e. ON/OFF signal.

(6) An actuator such as an electromagnetic valve, lamp, relay, small DC motor, etc., which is supplied or cut-off with electric power to be driven or stopped upon receiving an ON/OFF signal.

In such a measurement instrument or a driven device such as an actuator, an instruction side to send instruction to the plant and equipment is insulated from a side performing measurement or driving or controlling in the plant side (hereafter referred to as the plant side) depending on use for the purpose of preventing affections on the human body or evading affections of noise. This is generally done by adopting an insulation transformer as a transducer of the power source for supplying electric power or insulating a measurement signal sent from the plant side to instruction side from an instruction signal or control signal sent from the instruction side to the plant side by means of a photocoupler, insulation signal relay, insulation amplifier, insulation transformer, etc.

In recent years, there has been increased demand for soundness diagnosis to diagnose the state of signals in circuits in the field of instrumentation and measurement for the purpose of raising reliability by confirming soundness of output signals and circuit wiring, that is, confirming whether there is breaking of wire or short-circuit occurred in the circuits, and whether actuators for controlling and driving are operating as instructed.

FIGS. 18 to 27 show examples of conventional measuring means such as sensors, transmitter for measurement, etc., driven devices such as drive means and control means such as servo valves, relays, actuators including motors in block diagrams.

FIGS. 18 to 23 show cases where soundness diagnoses are not performed, whereas FIGS. 24 to 27 show cases where a circuit for performing soundness diagnosis is provided.

First, examples of conventional circuits not provided with soundness diagnosing circuit will be explained one by one.

FIG. 18 is a block diagram of a circuit in the case of the item (1), i.e. in the case of a sensor such as a transmitter for measurement, which is supplied with electric power and outputs measurement results of temperature, humidity, and pressure converting them into analog signals.

Electric power of 24 V, for example, is supplied to a transmitter for measurement 100, signal conversion circuit 108, and modulation circuit 109, from a power source circuit 101.

The power source circuit 101 consists of a pulse generating circuit 103 for converting electric power supplied from a power source 102 into pulse voltage, an insulation transformer 104 for changing the voltage of the pulse voltage from the pulse generating circuit 103 and insulates the plant side from instruction side, a rectifying circuit 105 for rectifying the pulse voltage transformed by the insulation transformer 104, and a constant-voltage circuit 106 for smoothing the rectified pulse voltage into a constant voltage.

The signal conversion circuit 108 and modulation circuit 109 are for inputting measurement results of temperature, humidity and pressure as AC signals to the insulation transformer 110 used for dividing the measurement transmitter 100 side from the instruction side. The measurement transmitter 100 can not input the measurement signals to the insulation transformer 110, because electric currents generated by the temperature, humidity and pressure sensors are currents varying in a range of about 4~20 mA. Therefore, the measurement results obtained as electric currents are converted into voltage signals by the signal conversion circuit 108, and further converted into alternating voltage signals by the modulating circuit 109 to be inputted to the insulation transformer 110. Then, the output of the insulation transformer 100 is reconverted to a current or voltage signal 112 to be outputted outside as measurement results.

A broken line denoted by reference numeral 107 in FIG. 18 represents an insulation barrier insulating the measuring side (instruction side) from the measuring device side (plant side). In the following explanation, constituent components similar to those in FIG. 18 are denoted by the same reference numerals and detailed explanation is omitted.

FIG. 19 is a block diagram of a circuit in the case of the item (2), i.e. in the case of a sensor such as a thermocouple and resistance thermometer bulb, which outputs measurement result as a change in voltage and electric resistance.

The power source circuit 101 consists, similarly to the case of FIG. 18, of a power source 102, pulse generating circuit 103, insulation transformer 104, and rectifying circuit 105, constant-voltage circuit 106. Electric power is supplied to a signal conversion circuit 121 and modulation circuit 122. The voltage signals and resistance signals from thermocouples and resistance thermometer bulb are converted into voltage signals by the signal conversion circuit 121 and converted into AC signals by the modulation circuit 122, amplified by an insulation transformer 123 which is a signal insulating means to insulate the plant side from instruction side, then the output from the insulation transformer 123 is reconverted into current or voltage signals 125 by a demodulating circuit 124 to be outputted outside as measurement results.

FIG. 20 is a block diagram of a circuit in the case of the item (3), i.e. in the case of a control actuator 130 (hereafter referred to as an object) such as a servo valve which is supplied with electric power and controls valve opening from full open to full close in accordance with imputed voltage signals.

The power source circuit 101 consists, similarly to the case of FIG. 18 and FIG. 19, of a power source 102, pulse generating circuit 103, insulation transformer 104, and rectifying circuit 105, constant-voltage circuit 106.

A voltage signal 131 for driving the object 130 is converted into an AC signal by a modulation circuit 132, the AC signal is amplified by an insulation transformer 133 in which the AC signal is insulated between the plant side and instruction side, then demodulated by a demodulating circuit 134 which is supplied with electric power from the power source circuit 101, and converted by a signal conversion circuit 135 which is also supplied with electric power from the power source circuit 101 to be inputted to the object 130.

FIG. 21 is a block diagram of a circuit in the case of the item (4), i.e. in the case of a control means having a contact for switching-on and -off upon detecting that pressure or temperature reaches a prescribed value and being utilized for detecting ambient conditions, with electric power supplied to the control means. The power source circuit 101 for supplying electric power to drive contact 140 and 143 which outputs an ON-OFF signal consists, similarly to the case of FIG. 18, FIG. 19, and FIG. 20, of a power source 102, pulse generating circuit 103, insulation transformer 104, and rectifying circuit 105, constant-voltage circuit 106. Even in a case there are a plurality of contacts as this case, a single power source circuit 101 is provided generally for common use for the contacts in view of cost saving.

When the contact 140, 143 is switched on or off at the prescribed pressure or temperature, the signal is sent to a photocoupler 141, 144 which is used for insulating between the plant side and instruction side, a light emitting element of the photocoupler 141, 144 emits light when the contact 140, 143 is ON, a binary signal 142, 145 of ON/OFF is outputted from a light sensitive element of the photocoupler 141, 144. In this way, temperature or pressure of the plant side is transmitted to the instruction side or object to be controlled.

FIG. 22 is a block diagram of a circuit in the case of the item (5), i.e. in the case of a control means such as a relay contact or ON/OFF switching means made of semiconductor, which actuates upon receiving an ON/OFF signal.

A binary signal 153, 154 for switching-on or -off a contact 151, 152 is inputted to a photoMOS relay 155, 156 which is used for insulation similarly as in the case of FIG. 21, and the contact 151, 152 is driven similarly as in the case of FIG. 21. A broken line denoted by a reference numeral 157 indicates an insulation barrier for insulating the plant side from instruction side by the photoMOS relay 155, 156, and this insulation barrier also insulates signals sent to the contact 151, 152.

FIG. 23 is a block diagram of a circuit in the case of the item (6), i.e. in the case of an actuator 163 such as an electromagnetic valve, lamp, relay, small DC motor, etc. (hereafter referred to as an object depending on circumstances), which is supplied or cut-off with electric power to be driven or stopped upon receiving an ON/OFF signal. A drive voltage signal 160 is inputted to a signal insulation relay 161 for insulating the plant side from instruction side similarly as in the case of FIG. 22, and electric power supplied from a DC power source 162 provided separately is transmitted to the object 163 which is an actuator such as an electromagnetic valve, lamp, relay, small DC motor, etc. to drive it.

Measurement and control by the measuring means and drive means as mentioned in the items (1) to (6) used to control the plant and equipment are performed in this way. As can be seen from the explanation above, it is necessary to provide insulation power source using an insulation transformer, etc., and when sending signals from the instruction side to plant side and vice versa, an insulating means such as a photocoupler, signal insulation relay, insulation amplifier.

Next, cases where a circuit for performing soundness diagnosis is added to the circuits explained above will be explained. The soundness diagnosing circuit is provided to raise reliability by confirming soundness of output signals and circuit wiring, that is, confirming whether there is breaking of wire or short-circuit occurred in the circuits, and whether actuators for controlling and driving are operating as instructed.

In the circuits shown in FIG. 18 and FIG. 19, that is, in the case of the item (1), i.e. in the case a sensor such as a transmitter for measurement, which is supplied with electric power and outputs measurement results of temperature, humidity, and pressure converting them into analog signals, and in the case of the item (2),i.e. in the case a sensor such as a thermocouple and resistance thermometer bulb, which outputs measurement result as a change in voltage and electric resistance, soundness of a circuit can be judged to some extent from a condition that a measurement result is not inputted to the instruction side or a measurement result does change from a constant value.

However, in the cases of FIGS. 20 to 23, that is, in the case of the item (3), i.e. in the case of a control actuator such as a servo valve which is supplied with electric power and controls valve opening from full open to full close in accordance with imputed voltage signals, in the case of the item (4), i.e. in the case of a control means having a contact for switching-on and -off upon detecting that pressure or temperature reaches a prescribed value and being utilized for detecting ambient conditions, the means being supplied with electric power, in the case of the item (5), i.e. in the case of a control means such as a relay contact or ON/OFF switching means made of semiconductor, which actuates upon receiving an ON/OFF signal, and in the case of the item (6), i.e. in the case of an actuator such as an electromagnetic valve, lamp, relay, small DC motor, etc., which is supplied or cut-off with electric power to be driven or stopped upon receiving an ON/OFF signal, it is necessary to confirm whether the control means are working normally, in addition to whether there is breaking of wire or short-circuit occurred in the circuits, etc.

However, confirmation of whether the control means and actuators are working in accordance with instructions can not be implemented without providing some kind of composition for the purpose. FIGS. 24-27 show examples of block diagrams of circuits added with soundness diagnosing circuits in the cases of the items (3) to (6). The examples of FIGS. 24 to 27 correspond to those of FIGS. 20-23 respectively, similar constituent elements are denoted by the same reference numerals, and explanation of the components is omitted.

First, FIG. 24 is a block diagram of a circuit in the case of the item (3), i.e. in the case of a control actuator such as a servo valve (hereafter referred to as an object depending on circumstances) which is supplied with electric power and controls valve opening from full open to full close in accordance with imputed voltage signals as explained in FIG. 20. The power source circuit 101 consists, similarly to the case of FIG. 20, of a power source 102, pulse generating circuit 103, insulation transformer 104, and rectifying circuit 105, constant-voltage circuit 106. An actuator which is the object 130 to be driven is driven by the signal (similarly as in FIG. 20) obtained by converting the voltage signal 131 into an AC signal by the modulation circuit 132, amplifying the AC signal by the insulation transformer 133, demodulating by the demodulating circuit 134, and converting by the signal conversion circuit 135 into a voltage or current signal corresponding to the voltage signal 131.

A diagnosing circuit in this case is composed such that; it comprises a signal conversion circuit (for current) 136a and same (for voltage) 136b, which are supplied with electric power from the electric power circuit 101 and detect the current or voltage inputted from the signal conversion circuit 135 to the object 130, modulation circuits 137a and 137b for modulating the signals from the signal conversion circuit 136a and 136b into AC signals respectively so that they can be inputted to insulation transformers 138a and 138b respectively, and demodulation circuit 139a and 139b for demodulating the voltages transformed by the transformer 138a and 138b respectively; and diagnoses whether the circuit is operation as instructed, whether there is breaking of wire or short-circuit occurred in the circuits, etc. by detecting whether electric current is passing to the object 130, whether applied voltage is appropriated for the operation of the object, etc.

FIG. 25 is a block diagram of a circuit in the case of the item (4), i.e. in the case of a control means (hereafter referred to as a contact) having a contact for switching-on and -off upon detecting that pressure and temperature reaches a prescribed value and being utilized for detecting ambient conditions, the means being supplied with electric power, as explained in the case of FIG. 21.

The power source circuit 101 consists, similarly to the case of FIG. 21, of a power source 102, pulse generating circuit 103, insulation transformer 104, and rectifying circuit 105, constant-voltage circuit 106. Even in a case there are a plurality of contacts as this case, a single power source circuit 101 is provided generally for common use for the contacts in view of cost saving similarly to the case of FIG. 21.

Diagnosis is performed by a block 146, which is composed of a microcomputer, etc. such that condition of the contacts are perceived and evaluated in an analog fashion by means of an A/D conversion means and soundness of the circuit is judged by confirming the state of ON/OFF switch, existence of short-circuit and malfunction of the contacts, and breaking of wire or short-circuit in the circuit, etc. The result of the diagnosis is sent to a photocoupler 141 which is a means to insulate signals between the plant side and instruction side, and outputted from the photocoupler 141 as serial communication signals to be sent to a signal receiving part 147.

In this case, a common power source is utilized for a plurality of signals from point of view of cost saving, so when two or more contacts different largely in location are provided, difference in voltage occurs due to difference in voltage drop caused by difference of length of signal wires. Therefore, it is necessary principally to perform diagnosis contacts located near to one another. Because of common power source, the block 146 for diagnosing the soundness of the circuit performs evaluation of signals in an analog fashion in the plant side.

FIG. 26 is a block diagram of a circuit in the case of the item (5), i.e. in the case of a control means such as a relay contact or ON/OFF switching means made of semiconductor, which actuates upon receiving an ON/OFF signal (hereafter referred to as a contact). Though the power source circuit 101 is not used in the case of FIG. 22, a diagnosing circuit composed of a microcomputer, etc. is needed in this circuit of FIG. 26 to diagnose the state of contact, etc. similarly to the case of FIG. 25. In addition, when each of the contacts is insulated separately between the plant side and instruction side, an insulation power source is needed for each of the contacts separately to drive each diagnosing circuit.

Each of power source circuits is composed similarly as in the above examples, and when the number of contacts is two for example, they respectively consist of a power source 102a, 102b, a pulse generating circuit 103a, 103b, an insulation transformer 104a, 104b, rectifying circuit 105a, 105b, and a constant-voltage circuit 106a, 106b.

A binary signals 153, 154 for switching on/off a contact 151, 152 is inputted to a photocoupler 155, 156 used for the purpose of insulation between the plant side and instruction side similarly to the case of FIG. 21, then sent by way of a monitoring circuit 158a, 158b for checking contact conditions of the contact signal and read over signal to the contact 151, 152 to drive it. The signal checked by the monitoring circuit 158a, 158b is outputted via a photocoupler 159a, 159b as a read over signal.

That is to say, in order to perform diagnosis of soundnedd of the circuit such as whether the photocouplers 155, 156, contacts 151, 152, etc, are working normally, whether there is no braking of wire and short-circuit, it is necessary to provide the monitoring circuits 158a, 158b and power source circuits 101a, 101b for driving the monitoring circuits. Therefore, actual example of use is limited to very special use.

FIG. 27 is a block diagram of a circuit in the case of the item (6), i.e. in the case of an actuator such as an electromagnetic valve, lamp, relay, small DC motor, etc. (hereafter referred to as an object depending on circumstances), which is supplied or cut off with electric power to be driven or stopped upon receiving an ON/OFF signal, as explained in the case of FIG. 23.

In the case of FIG. 23, the DC power source 162 for driving the object 163 which is an actuator such as an electromagnetic valve, lamp, relay, small DC motor, etc., is provided, and a drive voltage signal 160 is supplied to the object 130 via the signal insulation relay 161. This is the same also in the case of FIG. 27.

In the case of FIG. 27, there are provided a signal conversion circuit 164 for detecting the current of the actuator 163 and convert it into a voltage signal, a modulating circuit 165 for modulating the voltage signal into an AC signal, an insulation transformer 166, a demodulating circuit 167 for demodulating voltage signal into current signal, and a power source circuit 101 for driving a signal conversion circuit 164 and modulating circuit 165, the circuit 101 consisting of the power source 102, pulse generating circuit 103 insulation transformer 104, rectifying circuit 105, and constant-voltage circuit 106 similarly in the case of FIG. 25, for the purpose of diagnosing soundness of the circuit such as whether the object, i.e. actuator 160 is operating as instructed, and whether there is no breaking of wire or short-circuit, etc.

The drive voltage signal 160 is inputted to the signal insulating relay 161 for signal insulation, and the power form the DC power source 162 is sent to the object such as a electromagnetic calve, lamp, relay, small DC motor via the signal insulating relay 161 to drive the object similarly to the case of FIG. 23. The current sent from the DC power source 162 via the signal insulation relay 161 is detected by the signal conversion circuit 164 for detecting current, the detected current is converted into an AC voltage signal by the modulating circuit 165 to be inputted to the insulation transformer 166, then converted into a current signal by the demodulating circuit 167 to be outputted as a read over current signal 168.

As mentioned above, in the case of FIG. 27, additional circuits such as signal conversion circuit 164, modulating circuit 165, insulation transformer 166, and demodulating circuit 167, and the power source circuit 101 to drive them are needed. Therefore, manufacturing cost increases very much and actual example of use is limited to very special use.

As has been mentioned, in the case of conventional circuit, even if soundness diagnosis of the circuit is not performed, an insulation power source having a constant-voltage circuit is needed to perform accurate measurement and drive excluding the cases of the item (5), i.e. the case of a control means such as a relay contact or ON/OFF switching means made of semiconductor, which actuates upon receiving an ON/OFF signal, and the case of the item (6), i.e. the case of an actuator for controlling an electromagnetic valve, lamp, relay, small DC motor, etc., which is supplied or cut-off with electric power to be driven or stopped upon receiving ON/OFF signal.

In the case of the item (1), i.e. in the case of a sensor such as a transmitter for measurement, which is supplied with electric power and outputs measurement results of temperature, humidity, and pressure converting them into analog signals, in the case of the item (2), i.e. in the case of a sensor such as a thermocouple and resistance thermometer bulb, and in the case of the item (3), i.e. in the case of a control actuator such as a servo valve which is supplied with electric power and controls valve opening from full open to full close in accordance with imputed voltage signals, a signal conversion circuit, modulating circuit, insulation transformer and demodulating circuit are necessary to be provided.

In the case the item (4), i.e. in the case of a control means having a contact for switching-on and -off upon detecting that pressure or temperature reaches a prescribed value and being utilized for detecting ambient conditions, the means being supplied with electric power as shown in FIG. 21, a single common power source is provided for a plurality of signals from point of view of cost saving even when it is desired to receive signals from a plurality of contacts in a state they are insulated from one another. Therefore, when two or more contacts different in location largely are provided, difference in voltage occurs due to difference in voltage drop caused by difference of length of signal wires. Therefore, it has been necessary principally to perform diagnosis of contacts located near to one another.

Furthermore, when incorporating a soundness diagnosing function in a circuit, there occur problems as follows:

(A) It is necessary to provide a power source and circuit for performing soundness diagnosis in addition to a transfer circuit for transferring signals for commanding measurement, drive, or control, and signals for telling measurement result, which causes increase in the number of parts, complexity of the circuitry, and manufacturing cost.

(B) In a case there are a plurality of contacts and they are insulated from one anther, when a soundness diagnosing circuit is provided for each of the contacts and the contacts are located distantly from one another, it is necessary to provide an expensive insulation power source for each soundness diagnosing circuit, causing further increase of manufacturing cost.

(C) To cope with this, when a single expensive insulation power source is provided for common use for each of the contacts, and when the contacts are located distantly from one another, difference in voltage occurs due to difference in voltage drop caused by difference of length of signal wires. Therefore, it has been necessary principally to perform diagnosis of contacts located near to one another.

(D) As the power source for driving an electromagnetic valve, etc. must be large in capacity as compared with that used for instrumentation and measurement, the former must be provided separately.

(E) When transmitting DC signals via a insulation transformer or insulation amplifier, the DC signals must be modulated once into AC signals, and then demodulated into DC signals.

As to the art for detect braking of wire, there are disclosed for example in patent literature 1 (Japanese Laid-Open Patent Application No. 2006-023105) a method of detecting breaking of wire by applying a pulse signal to the wire, and comparing the current wave shape measured with the reference current wave shape to judge the presence or absence of breaking of wire from difference in both the wave shapes, and in patent literature 2 (Japanese Laid-Open Patent Application No. 2004-198302) a circuit for detecting breaking of wire by applying a pulse signal for checking via an impedance component to the signal wire for detecting breaking of wire, and comparing the signal obtained from the signal wire with the pulse signal for checking to judge the presence or absence of breaking of wire.

A to diagnosis of electric circuits, there is disclosed for example in patent literature 3 (Japanese Laid-Open Patent Application No. 8-005708) a method of diagnosing electric circuits and diagnosing device used for the method. With which conditions of electric apparatuses are diagnosed for the purpose of improving efficiency of diagnosis operation by facilitating measurement record management and further decreasing occurrence of man-caused errors, by reading out information written and stored in a nonvolatile memory concerning measurement results of characteristics or things concerning measurement of the electric apparatuses, and comparing the read-out information with the information of-the-moment concerning measurement results of characteristics or things concerning measurement of the electric apparatuses.

However, with the art taught in the patent literature 1 and 2, means for applying pulse signals and a memory for memorizing reference current wave shape are needed, and with the electric circuit diagnosing device disclosed in the patent literature 3, a memory memorized information concerning measurement results of characteristics or things concerning measurement of the electric apparatuses is needed, and further a means for measuring characteristics of the circuit and a means for comparing the measurement result with the reference data, resulting in complicated composition. Therefore, problems cited in the items (A)~(B) can not be solved by these art.

SUMMARY OF THE INVENTION

The object of the invention is to provide a method and device for diagnosing signal status in measurement, drive, or control by a measuring, drive or control means, and a transformer used in the device. According to the method and device, transmission of signals indicating the operating conditions of a device-to-be-driven, which performs measurement by a measuring means such as a sensor and a transmitter for measurement, or performs drive or control by a drive means or control means such as an actuator including servo valve, relay, and motor; transmission of signals indicating breaking of wire or short-circuit; and transmission of electric power; can be performed by the same means with simple construction without increase in the number of constituent elements and complication of the circuit configuration which will result in increased manufacturing cost, and transmission of measurement result and diagnosis of signal status and soundness of the circuit can be performed with high accuracy. By the invention, the problems that, in order to perform diagnosis of signal status and soundness of circuit, an expensive insulation electric power source is needed to be provided for each diagnosing circuit when insulating a plurality of contacts separately or contacts are located remote from one another, that when transmitting DC signals, modulation to AC signals and demodulation to DC signals are needed, and that when driving electromagnetic valves, etc., it is difficult to provide an insulation electric power source for each of the valves, etc. separately, can be solved.

To solve the problem mentioned above, the present invention proposes a method for diagnosing signal status in measurement, drive, or control by a measuring, drive or control means, by connecting a signal generating means for generating an alternating voltage including a pulse voltage to the primary side of a transformer and a device-to-be-driven for performing measurement, drive, or control to the secondary side of the transformer, comprising putting the device-to-be-driven connected to the secondary side into action by electric power sent via the transformer, measuring change in the current of the primary side caused by electric power consumed for the action of the device-to-be-driven, and diagnosing signal status in the measurement, drive, or control by the device-to-be-driven based on the measurement result of said change in current.

The invention proposes to implement the method, a device for diagnosing signal status in measurement, drive, or control by a measuring, drive or control means comprising a transformer, a signal generating means for generating an alternating voltage including a pulse voltage connected to the primary side of the transformer, and a device-to-be-driven for performing measurement, drive, or control connected to the secondary side of the transformer, wherein is provided a measuring means for measuring change in the current of the primary side caused by electric power consumed for the action of the device-to-be-driven, whereby diagnosis of signal status in the measurement, drive, or control by the device-to-be-driven is performed based on the measurement result of said change in current.

By measuring the change in primary side current caused by the consumption of the electric power supplied via the transformer by the device-to-be-driven connected to the secondary side of the transformer, and diagnosing the signal status based on the measurement result in addition to supplying electric power to the driving the device-to-be-driven to drive the measuring means, drive means, or control means to perform measurement, drive, or control, it becomes possible to perform transmission of measurement result and diagnosis of signal status and soundness of the circuit with simple construction without increase in the number of constituent elements and complication of the circuit configuration which will result in increased manufacturing cost, eliminating the necessity of providing an insulation means such as an insulation electric power source and insulation transformer, signal conversion means, and demodulating means for each of devices-to-be-driven as needed in conventional devices for diagnosing signal status.

The transformer is provided with an intermediate tap at the intermediate part of the primary winding, and the current measurement means is connected to the intermediate tap so that the change in the primary current is measured by the current measurement means.

However, with this configuration, when performing measurement in an analog fashion or diagnosing the condition of the device-to-be-driven in an analog fashion, if such a core material of which core loss varies significantly depending on temperature is used for the transformer, measurement result can not be transmitted accurately to the instruction side.

The invention proposes a transformer used in a device for diagnosing signal status in measurement, drive, or control performed by a device-to-be-driven in a circuit in which a signal generating means for generating an alternating voltage signal including a pulse voltage is connected to the primary side of the transformer and said device-to-be-driven is connected to the secondary side of the transformer, said signal status being diagnosed based on measurement result of change in the primary side current of the transformer caused by the drive of a signal conversion circuit for converting the operation condition of said device-to-be-driven to a current signal, wherein said transformer adopts core material small in change of core loss by temperature change, and composed such that an intermediate tap is provided to the primary winding thereof to be connected to a current measuring means, the primary coil being divided into an anterior half and a posterior half such that the secondary coil is sandwiched by both the anterior half and posterior half of the primary coil with the intermediate tap taken out from the center of the primary coil.

By using core material, for example, of PC95 of TDK Ltd. made which is small in core loss change depending on temperature and dividing the primary coil into an anterior oil and posterior coil with the intermediate tap taken out from the center between the anterior and posterior coils, signals can be transmitted with high accuracy also in the case of analog signals as described later referring to a test result.

When the device-to-be-driven is a measurement device of voltage generation type or resistance changing type, by providing a signal conversion means which is supplied with electric power from said transformer and consumes a current corresponding to the measurement result of said measurement device, the measurement result can be known by the primary current of the transformer just the same in the case of the voltage generation type or resistance changing type of the measurement device.

A device for diagnosing signal status in the case of the device-to-be-driven being a control actuator which operates on a drive voltage corresponding to the voltage of a voltage signal, by composing such that; the signal generating means is composed such that said drive voltage is generated in the secondary side of the transformer receiving the input voltage signal, and a feedback means is provided, by which primary side current generated by the current consumed depending on operating condition, normal or abnormal, of the actuator which is a device-to-be-driven, or presence or absence of breaking of wire or short-circuit, is converted into a voltage which is fed back to the input voltage signal; whether the actuator is operating normally or not and breaking of wire or short-circuit has occurred or not is diagnosed by comparing the input voltage after the feedback and measurement result of the primary side current.

A device for diagnosing signal status in the case of the device-to-be-driven is a control state detecting means which switches on or off at a prescribed pressure or temperature, and composed such that; the control state detecting means is connected to the secondary side of the transformer, and a means for changing the amount of secondary side current consumption to two different values depending on ON/OFF of the control state detecting means, a device for diagnosing signal status in the case of the device-to-be-driven is a control means which operates on binary signal such as ON/OFF signal including a contact, and there are provided, and composed such that; a voltage adjusting means which applies to the primary side of the transformer a voltage by which a voltage that drives said control means is generated in the secondary side of the transformer when said binary signal is an ON signal, and a voltage by which a voltage that does not drive the control means is generated in the secondary side of the transformer when the binary signal is an OFF signal; a detecting means for detecting operating condition of said control means to which a current flows when it operates is connected to the secondary side of the transformer; and a detection means for detecting a current flows in the primary side when the current flows in said control means operating condition detecting means, and a device for diagnosing signal status in the case of the device-to-be-driven is a control means which is supplied with electric power upon receiving a binary signal such as ON/OFF signal and operated by the supplied power, and composed such that a voltage adjusting means which applies to the primary side of the transformer a voltage by which a voltage that drives said control means is generated in the secondary side of the transformer when said binary signal is an ON signal, and a voltage by which a voltage that does not drive said control means is generated in the secondary side of the transformer when said binary signal is an OFF signal, are also preferable embodiments of the present invention As has bee described heretofore, the method and device for diagnosing signal status of the invention with which diagnosis of signal status in measurement, drive, or control by a measuring means, drive means, or control means can be performed with high accuracy without increasing the number of parts and complication of the circuit and increase in manufacturing cost, and without needs for providing an insulation means such as an electric power and source insulation transformer, signal conversion circuit, and demodulating circuit for each of devices-to-be-driven, as needed in conventional devices, can be provided by using the transformer according to the invention.

DETAILED DESCRIPTION OF THE PREFERRED EMBODIMENTS

Preferred embodiments of the present invention will now be detailed with reference to the accompanying drawings. It is intended, however, that unless particularly specified, dimensions, materials, relative positions and so forth of the constituent parts in the embodiments shall be interpreted as illustrative only not as limitative of the scope of the present invention.

Figure 1:
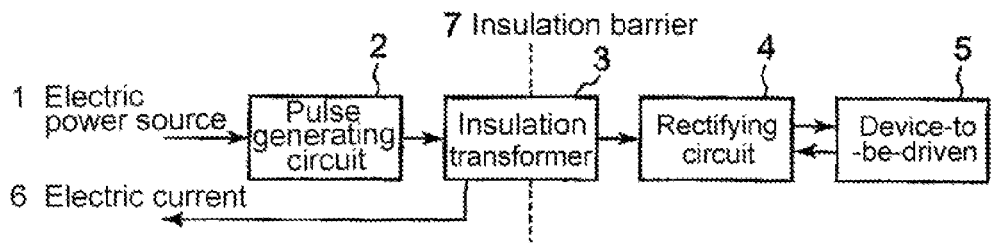
FIG. 1 is a representation for explaining the fundamental method of thinking of the present invention.

FIG. 1 is a representation for explaining the fundamental method of thinking of the present invention. In the drawing, reference numeral 1 is an electric power source, 2 is a pulse generating circuit for converting the electric power into a pulse voltage, 3 is an insulation transformer for transforming the voltage of the pulse voltage while insulating the plant side from the instruction side, 4 is rectifying circuit for rectifying the transformed pulse voltage, 5 is a device to be driven such as a drive means or control means like an actuator including a measuring means such as a sensor, transmitter for measurement, servo valve, relay, motor, etc., 6 is an electric current flowing in the primary coil of the insulation transformer 3. A broken line 7 indicates an insulation barrier between the plant side and instruction side. The primary current 6 of the insulation transformer 3 is measured by a current measurement instrument not shown in the drawing. The pulse generated by the pulse generating circuit 2 is preferable to be a rectangular wave, however, it may of course be an alternating wave of sine curve.

In the invention, the pulse generating circuit 2 is connected to the primary side of the insulation transformer 2, and to the secondary side thereof is connected the device-to-be-driven 5 such as a drive means or control means like an actuator including a measuring means such as a sensor, transmitter for measurement, servo valve, relay, motor, etc., directly or via the rectifying circuit 4. With this configuration, change in primary current 6 caused by the consumption of electric power by the device-to-be-driven 5 connected to the secondary side is measured, and operating condition of the device-to-be-driven 5, presence or absence of breaking of wire and short-circuit, i.e. the soundness of signal status is diagnosed based on the measurement of the primary side current.

Figure 18:
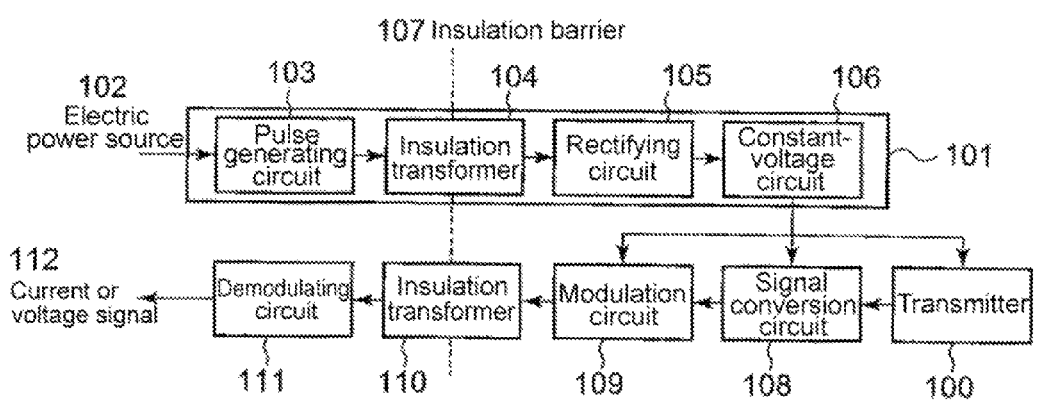
FIG. 18 is a block diagram of a conventional circuit for measuring temperature, humidity and pressure using a transmitter for measurement which is a kind of sensor for outputting measurement result of temperature, humidity and pressure, converting them into analog current with electric.

In the case as explained referring to FIG. 18, i.e.

(1) In the case of a sensor such as a transmitter for measurement, which is supplied with electric power and outputs measurement results of temperature, humidity, and pressure converting them into analog signals:

The current consumed by the transmitter for measurement can be detected by measuring the current of the primary side of the insulation transformer 3, and temperature, humidity, and voltage can be determined.

Figure 19:
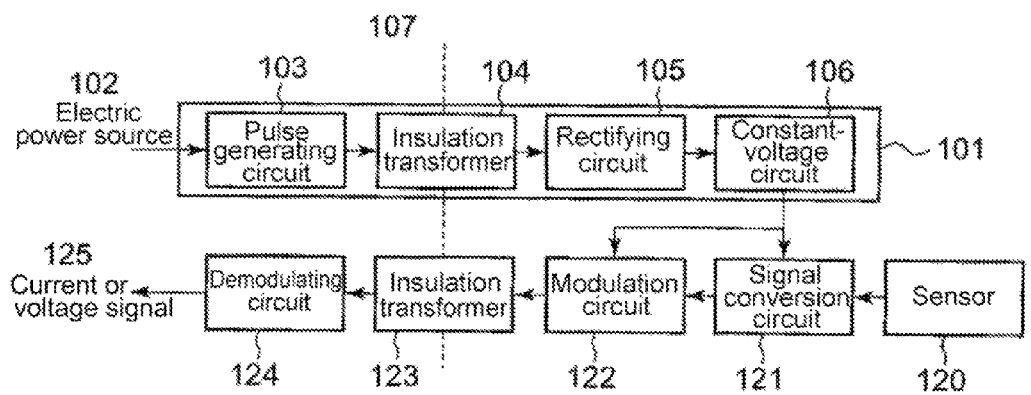
FIG. 19 a block diagram of a conventional circuit for measuring temperature using a sensor 120 such as a thermocouple for determining temperature by its thermoelectric power (voltage) or a thermistor for determining temperature by measuring electric resistance thereof.

In the case as explained referring to FIG. 19, i.e.

(2) In the case of a sensor such as a thermocouple and resistance thermometer bulb, which outputs measurement result as a change of voltage and electric resistance:

The voltage or resistance of the sensor can be detected by providing a signal conversion circuit which consumes as corresponding current the voltage or resistance of the sensor, and measuring the primary side current of the insulation transformer 3, which current varies depending on the current flowing in the signal conversion circuit.

Figure 20:
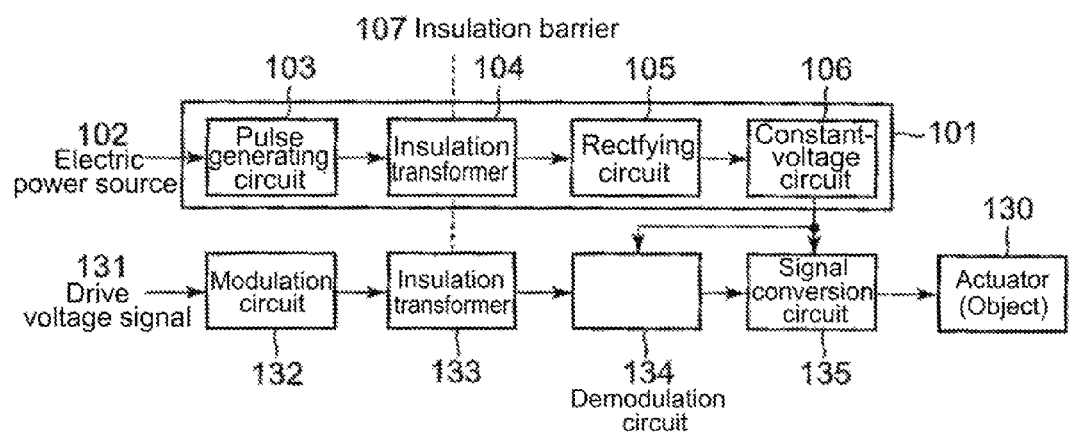
FIG. 20 is a block diagram of a conventional circuit for driving an actuator such as an electromagnetic valve which is fully opened or fully closed upon receiving voltage signal, or a servo valve of which opening is controlled between fully opened state and fully closed state in accordance with the voltage of a voltage signal.
Figure 24:
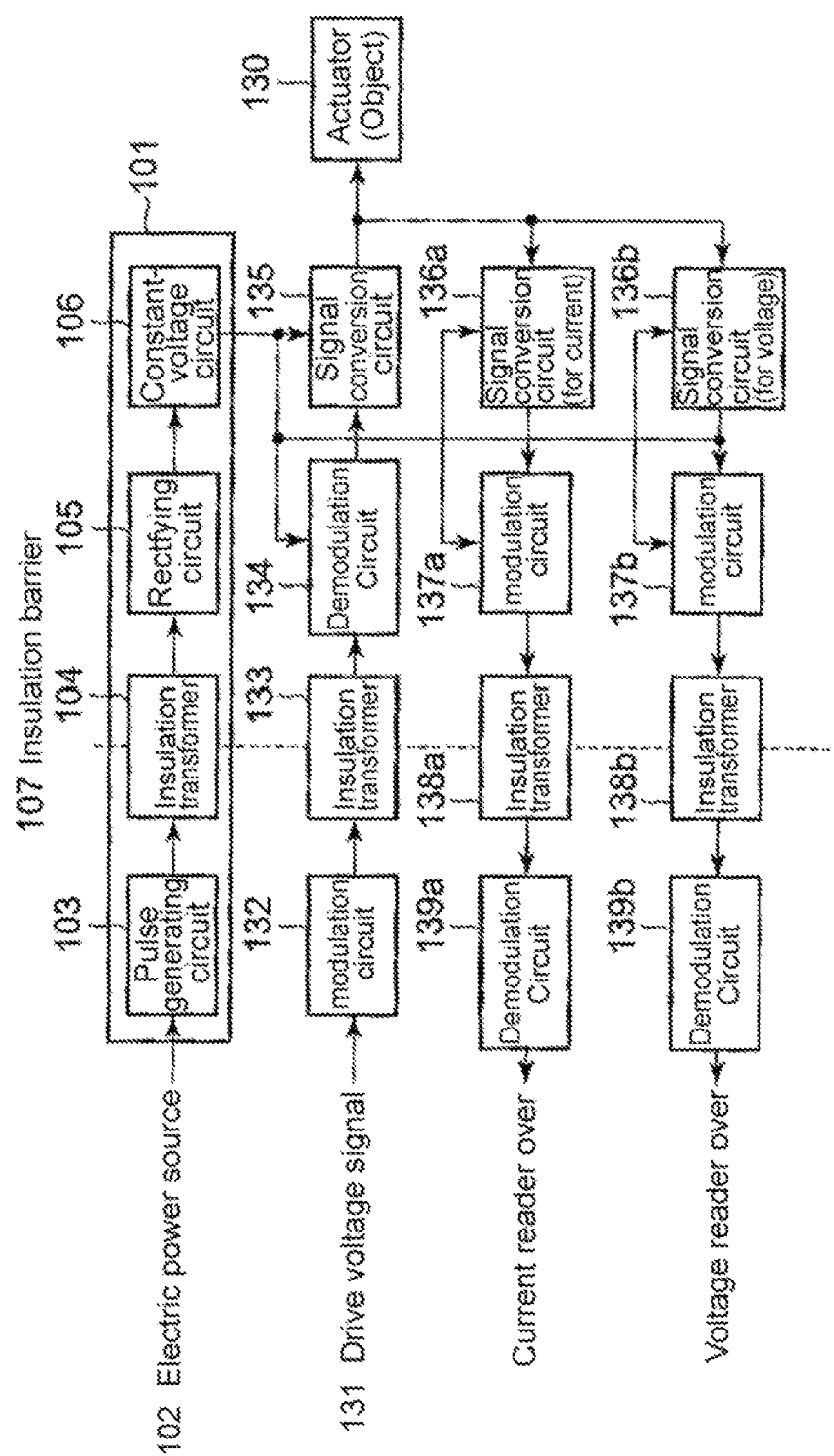
FIG. 24 is a block diagram of a conventional circuit provided with a circuit for performing diagnosis of signal status, for driving an actuator such as an electromagnetic valve which is fully opened or fully closed upon receiving voltage signal, or a servo valve of which opening is controlled between fully opened state and fully closed state in accordance with the voltage of a voltage signal.

In the case as explained referring to FIG. 20 and FIG. 24, i.e., (3) In the case of a control actuator such as a servo valve which is supplied with electric power and controls valve opening from full open to full close in accordance with imputed voltage signals:

The circuit is composed such that the output of the pulse generating circuit 2 becomes a voltage for driving the control actuator, the voltage being generated in the secondary side of the insulation transformer 3 by an input voltage signal, a feedback means is provided, by which primary side current generated by the current consumed depending on operating condition, normal or abnormal, of the actuator which is a device-to-be-driven, or presence or absence of breaking of wire or short-circuit, is converted into a voltage and this voltage is fed back to the input voltage signal, and whether the actuator is operating normally or not and breaking of wire or short-circuit has occurred or not is diagnosed by comparing the input voltage after the feedback and measurement result of the primary side current.

Figure 21:
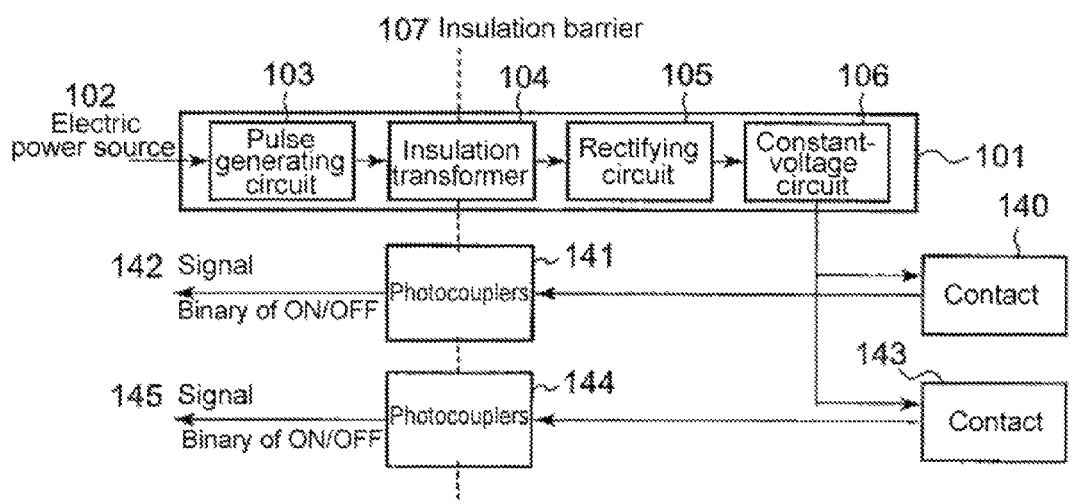
FIG. 21 is a block diagram of a conventional circuit in which a control means having contacts 140 and 143, which outputs ON/OFF signal upon detecting that pressure or temperature reaches a prescribed value and is utilized for detecting ambient conditions.
Figure 25:
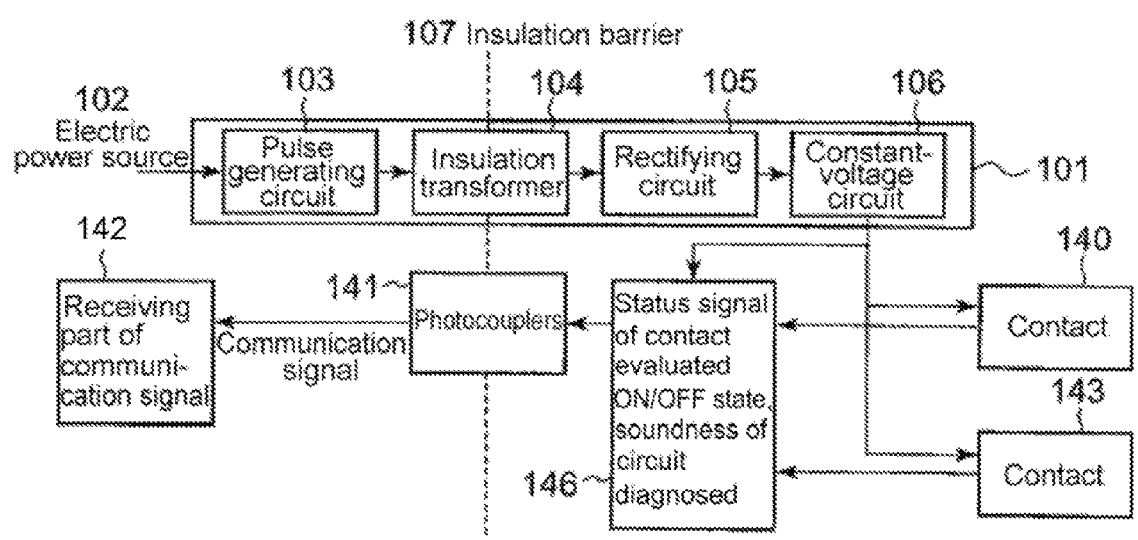
FIG. 25 is a block diagram of a conventional circuit provided with a circuit for performing diagnosis of signal status, in which a control means having contacts 140 and 143, which outputs ON/OFF signal upon detecting that pressure or temperature reaches a prescribed value and is utilized for detecting ambient conditions.

In the case as explained referring to FIG. 21 and FIG. 25, i.e., (4) In the case of a control means having a contact for switching-on and -off upon detecting that pressure or temperature reaches a prescribed value and being utilized for detecting ambient conditions, the means being supplied with electric power:

A means is provided to convert to a current consumption depending on the ON/OFF state switched the controlling means such as a contact, and primary side current change due to the change of the current consumption is measured, by which soundness, i.e. the ON/OFF state of the contact, breakage of wire, short-circuit, etc. is diagnosed. When a plurality of contacts are used, insulation can be possible without providing an insulation circuit each of the contacts by providing an insulation transformer for each of the contacts, and the ON/OFF state and soundness of each of the contacts can be diagnosed by measuring current of the insulation transformer provided for each contact.

Figure 22:
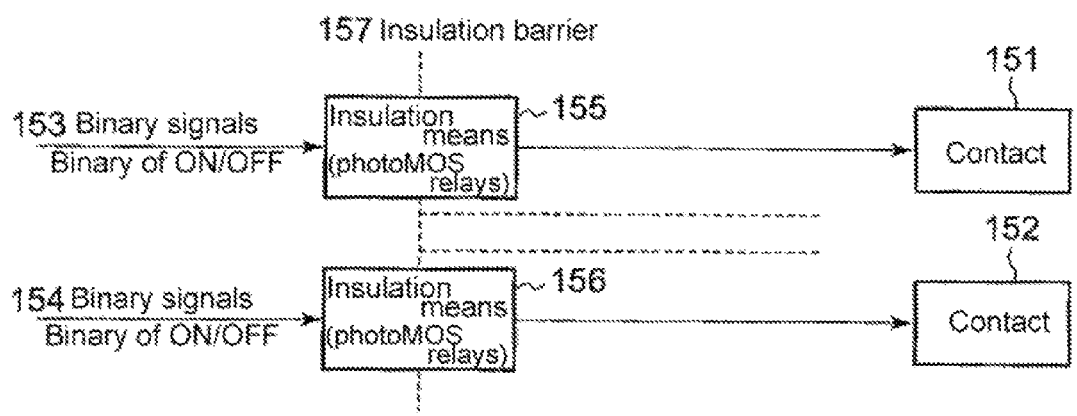
FIG. 22 is a block diagram of a conventional circuit for driving outside control means 151 and 152 upon receiving an ON/Off signal respectively.
Figure 26:
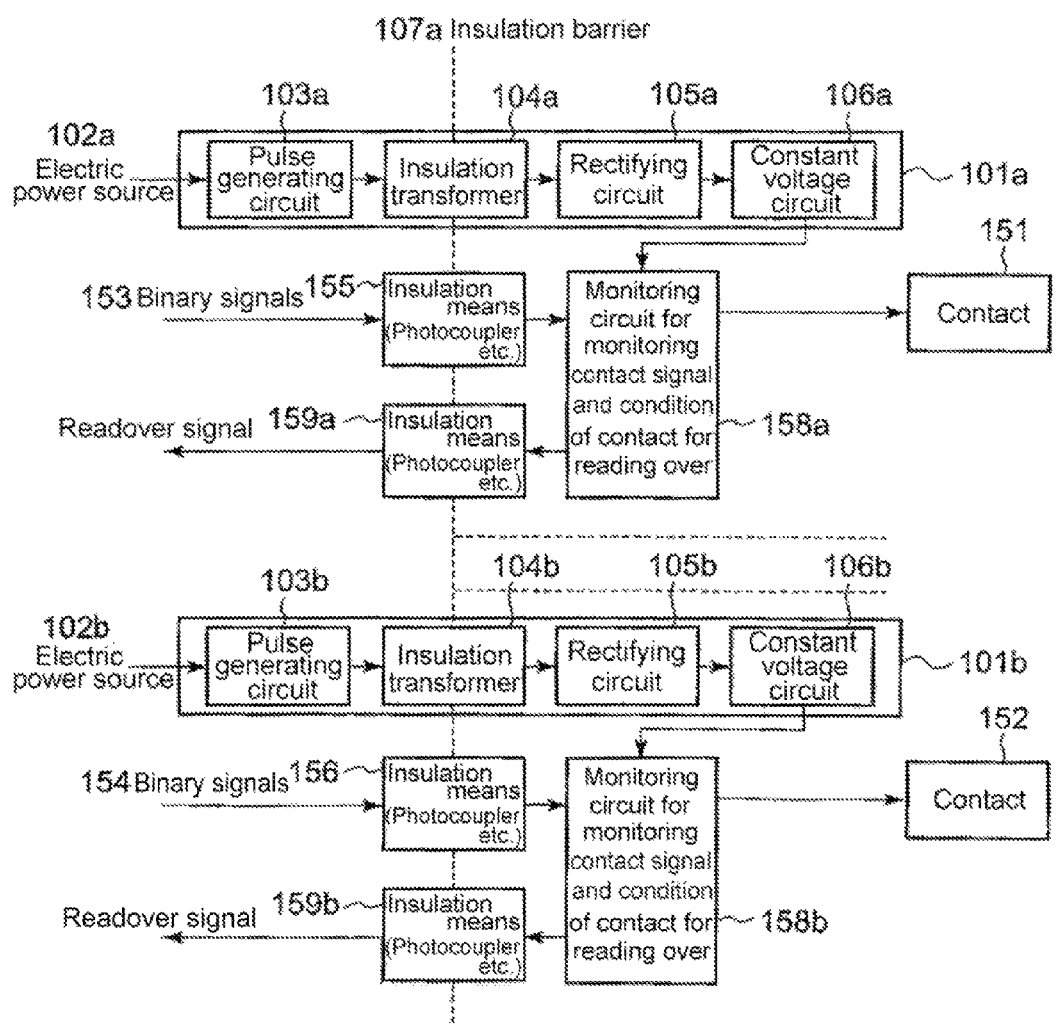
FIG. 26 is a block diagram of a conventional circuit provided with a circuit for performing diagnosis of signal status, for driving outside control means 151 and 152 upon receiving an ON/Off signal respectively.

In the case as explained referring to FIG. 22 and FIG. 26, i.e., (5) In the case of a control means such as a relay contact or ON/OFF switching means made of semiconductor, which actuates upon receiving an ON/OFF signal:

To the primary side of the insulation transformer 3 is provided a voltage coordination means which generates in the secondary side of the transformer 3 a voltage to allow the control means to operate upon receiving ON signal, and a voltage not to allow the control means to operate upon receiving OFF signal. To the secondary side of the insulation transformer 3 is provided a control means operation detecting means which generate an electric current in accordance with the operation of the control means. By measuring the primary side current induced by the current generated by the control means operation detecting means and flowing in the secondary side of the transformer 3, soundness diagnosis of operation of the control means such as a contact is performed.

In the case as explained referring to FIG. 22 and FIG. 26, i.e., (6) In the case of an actuator such as an electromagnetic valve, lamp, relay, small DC motor, etc., which is supplied or cut-off with electric power to be driven or stopped upon receiving an ON/OFF signal:

To the primary side of the insulation transformer 3 is provided a switch circuit composed such that a voltage of for example 24 volt is outputted from the insulation transformer 3 upon receiving ON signal and a voltage of for example 1 volt is outputted upon receiving OFF signal using FET (Field Effect Transistor), and so on, and a voltage corresponding to the voltage signal can be applied to the device-to-be-driven such as an actuator like the electromagnetic valve, lamp, relay, small DC motor. Diagnosis of operation condition of the device-to-be-driven and soundness of the circuit is performed by measuring the current flowing in the primary side of the insulation transformer 3.

By providing an arrangement to a part of the circuit to take out a signal indicative of the condition of the device-to-be-driven in this way, the need for adding an electric power source and soundness diagnosing circuit to the transfer circuit of instruction signals for measurement, drive, or control, and signals of measurement result, is eliminated. Further, even if the voltage applied to the device-to-be-driven fluctuates, if current caused by the fluctuation is constant in each state of the measurement, drive, or control, judgment of the condition is not influenced by the fluctuation. Therefore, it is not necessary to use a constant voltage power source, which contributes to cost saving. Furthermore, when there are a plurality of contacts insulated from one another, it is needed to provide only an insulation transformer for each of the contacts, which also contributes to cost saving.

When drive of the device-to-be-driven and transfer of the signal presenting the conditions of the measurement, drive, or control (the signal being a change of current generated in the primary side of the insulation transformer caused by the consumption of current due to the operation of the device-to-be-driven) are performed, there may occur a problem in regard to the accuracy of the signal, particularly in the case of analog signal transfer. However, it is all right when the error in the signal transfer is smaller than a permissible error. For example, when an error of about 0.2%~0.25% is permissible, a normal transformer can be adopted.

When higher accuracy, for example, an error of smaller than 0.1% is required, change of core loss depending on temperature of the transformer becomes most problematic. However, when the core loss is nearly constant in relation to temperature, it is no matter to judge the measurement result with high accuracy taking temperature into consideration, and measurement and transfer of analog signals is made possible with high accuracy.

Figure 2:
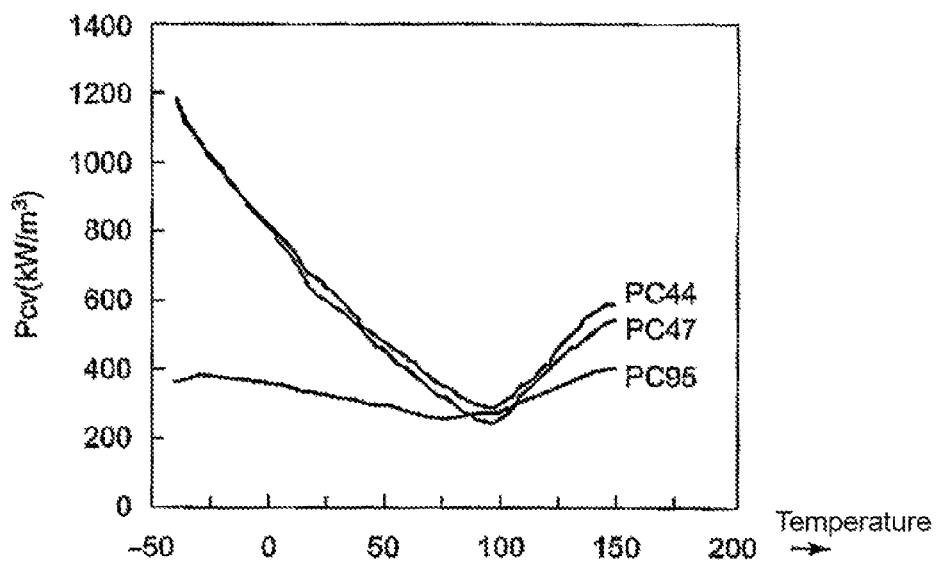
FIG. 2 is a graph showing core loss (electric power loss) vs. temperature characteristic of the core material used in the transformer of the invention.

FIG. 2 is a graph showing core loss characteristic (loss power (kW/cm$^3$) vs. temperature (° C.)) of several core materials. Core materials PC44 and PC47 of TDK Ltd. made which a peak value near 100° C., however, PC95 also of TDK Ltd. made has a relatively flat core loss characteristic. In the invention, PC95 was adopted as the core material of the insulation transformer. By this, a signal status diagnosing device can be provided which performs diagnosis of the status of signals in the measurement and control means in the device-to-be-driven with high accuracy.

Figure 3:
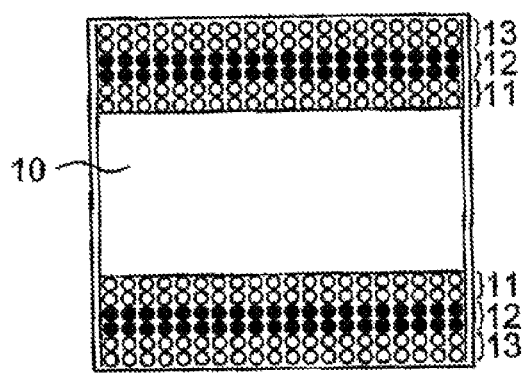
FIG. 3 is a pattern diagram showing winding of the primary and secondary coil around the core of the transformer used in the invention.

Further, the inventors of the application composed a transformer such that an intermediate tap is provided in an intermediate part of the primary winging, a current measuring means is connected to the intermediate tap, and change of primary side current caused by consumption of current supplied to the secondary side. As shown in FIG. 3, the primary coil is divided into an anterior half 11 and posterior half 13 such that a secondary coil 12 is sandwiched by both the primary coil 11 and 13, and the intermediate tap is taken out from the center of the primary coil. The inventors found out that a favorable signal transfer characteristic can be obtained with this composition of a transformer using PC95 as core material.

Figures 4A, 4B:
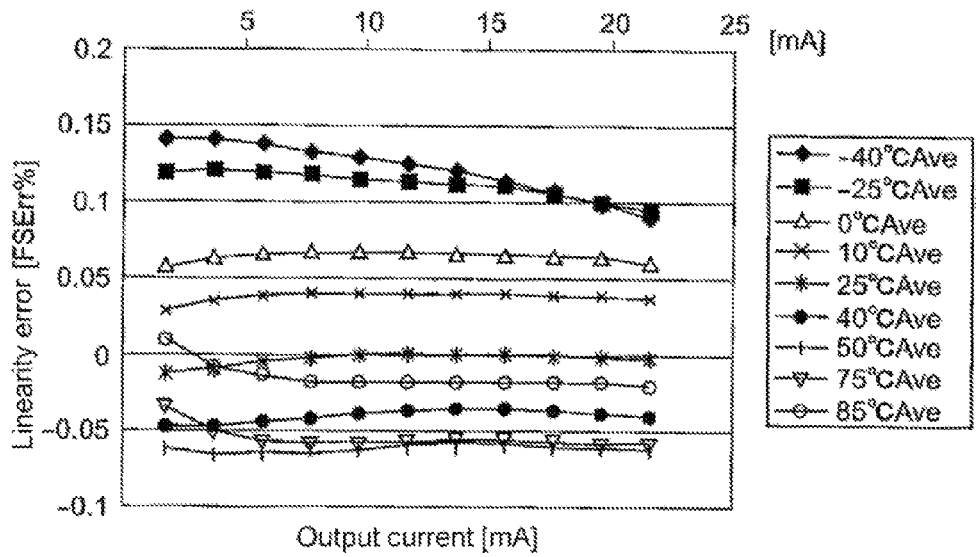
FIG. 4A is a graph of a test result showing linearity error of transfer characteristic of the transformer used in the invention (linearity error for various core temperature between −40~85° C. taking the transfer characterization factor at 25° C. as the reference value)
FIG. 4B is table showing the specifications of the transformer used in the test.

FIG. 4A is a graph showing a test result. The test was performed composing a distributor-isolation-amplifier using a insulation transformer composed using PC95 of TDK made as core material and arranging primary and secondary windings as shown in FIG. 3. Linearity and temperature drift were measured.

Specification of the insulation transformer used in the test is shown in the table of FIG. 4B. Measurement was performed using a precision resistance of accuracy of 10 ppm/° C.

In FIG. 4A is shown linearity errors of transfer characteristics for temperatures between −40~85° C., in which output currents (mA) of the distributor-isolation-amplifier are plotted as the abscissa and full scale errors % (4~20 mA is taken as 100%) are plotted as the ordinate, with the transfer characteristic factor at 25° C. taken as the reference value.

In the case of the conventional transformer composed by using PC44 or PC47 as core material to have a single primary coil not divided in two as shown in FIG. 3 and a secondary coil wound over the primary coil, linearity is ±0.05% or smaller, and about ±0.25% under environment of 0~60° C. Therefore, as can be recognized from FIG. 4A that, by composing the insulation transformer as described before, linearity of ±0.01% or smaller, about ±0.1% under environment of 0~85° C., and about 0.15%~0.1% under environment of −40~85° C. can be attained. It is thinkable that further improvement in accuracy and temperature characteristic can be attained by innovations in shape and size and increase of the number of winding of the insulation transformer.

Above is the fundamental method of thinking of the present invention. Hereunder, circuits according to the invention will be explained with reference to FIGS. 5-17 in correspondence with the circuit examples of FIGS. 18-27.

Figure 5:
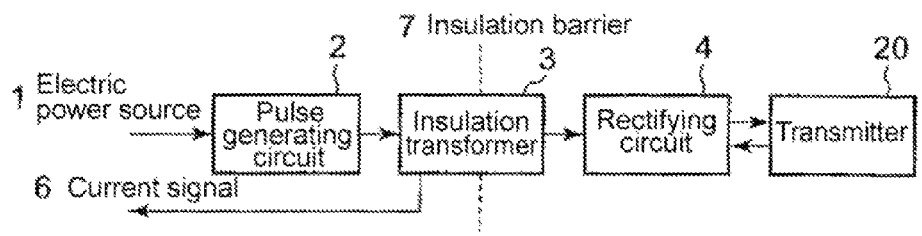
FIG. 5 is a block diagram of a circuit according to the invention for driving a measuring means such as a transmitter for measurement which is a kind of sensor for outputting measurement result of temperature, humidity and pressure, converting them into analog current with electric power supplied.
Figure 6:
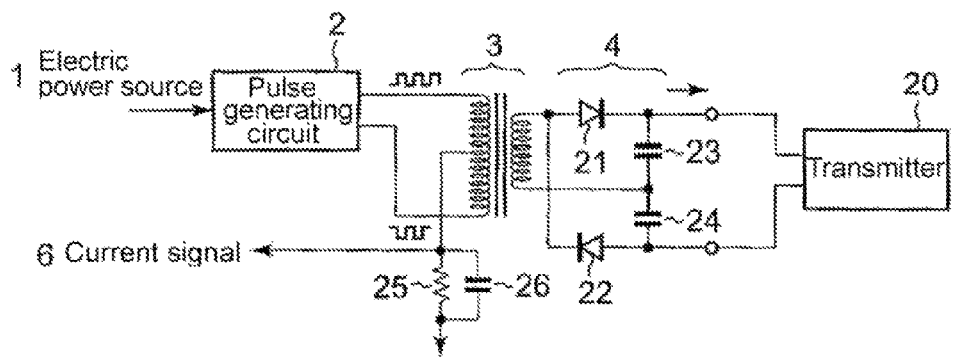
FIG. 6 is a diagram showing a circuitry according to the invention for driving a measuring means such as a transmitter for measurement which is a kind of sensor for outputting measurement result of temperature, humidity and pressure, converting them into analog current with electric power supplied.

First, FIG. 5 and FIG. 6 correspond to the case of FIG. 18, i.e. in the case of the following item (1):

(1) In the case of a sensor such as a transmitter for measurement, which is supplied with electric power and outputs measurement results of temperature, humidity, and pressure converting them into analog signals, and shown as a block diagram of circuit (FIG. 5) and as an example of circuitry (FIG. 6). Constituent components similar to those in FIG. 1 are denoted by the same reference numeral.

To describe briefly, in FIGS. 5 and 6, reference numeral 1 is an electric power source, 2 is a pulse generating circuit, 3 is an insulation transformer composed as described referring to FIG. 3 with PC95 adopted as material of its core, 4 is a rectifying circuit, 20 is a transmitter for measurement as a device-to-be-driven, 6 is a current signal flowing in the primary coil of the insulation transformer 3, a broken line 7 indicates an insulation barrier between the plant side and instruction side, 21, 22 is a diode composing the rectifying circuit 4, 23, 24 is a condenser also composing the rectifying circuit 4, 25 is a resistance for measuring current, and 26 is a condenser.

A pulse voltage signal of ON/OFF alternately shifting is applied to the both ends of the primary coils, so the current from the pulse generating circuit 2 flows into the primary coils from both ends of the primary coil without using a rectifying circuit in particular for the intermediate tap. It is permissible to use an alternating voltage of sine curve instead of the pulse voltage. Same applies to all circuits that will be explained hereunder.

In the circuit shown in FIGS. 5 and 6, the pulse generated by the pulse generating circuit 2 is increased in voltage by the insulation transformer 3, rectified by the rectifying circuit consisting of the diodes 21, 22 and condensers 23, 24, then flows to the transmitter for measurement 20 to supply electric power thereto. Current corresponding to temperature, humidity and pressure flows into the transmitter for measurement 20, so by measuring primary side current 6 which flows from the intermediate tap via the resistance 25 and condenser 26 by a measuring instrument not shown in the drawing, current flows in the transmitter for measurement 20 can be estimate.

When breaking of wire occurs in the circuit connected to the secondary winding of the insulation transformer 2 and a current does not flow to the transmitter for measurement 20, the current signal 6 from the intermediate tap is not detected, and when it is not breaking of wire cut short-circuit, a large current flows. Therefore, soundness of the circuit can be diagnosed by a phenomenon that an excessively large current is measured or no current is measured.

By composing a circuit like this, an effect similar to that the signal current which is a measurement result of the transmitter for measurement 20 is superposed on the pulse voltage or alternating voltage for supplying electric power, can be obtained. Therefore, a drive circuit for transmitting the measurement result of the transmitter for measurement 20 which is an analog signal can be obtained with high accuracy as explained referring to FIG. 4A and without providing such circuits in FIG. 18 as the signal conversion circuit 108 for signal insulation, modulating circuit 109, insulation transformer 110, and demodulation circuit 11.

Figure 7:
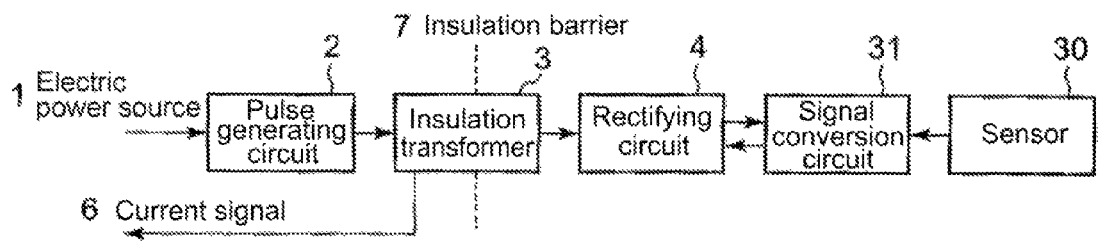
FIG. 7 is a block diagram of a circuit according to the invention for driving a sensor which outputs measurement result as change in voltage or electric resistance.
Figure 8:
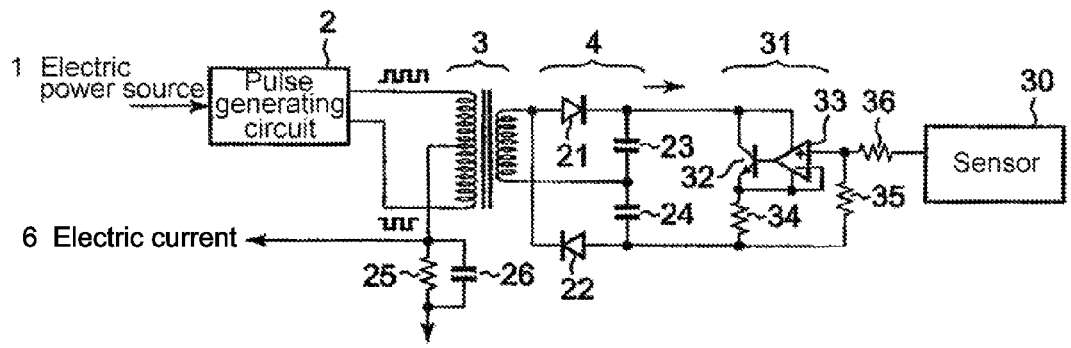
FIG. 8 is a diagram showing a circuitry according to the invention for driving a sensor which outputs measurement result as change in voltage or electric resistance.

FIG. 7 and FIG. 8 correspond to the case of FIG. 19, i.e. in the case of the following item (2):

(2) In the case of a sensor such as a thermocouple and resistance thermometer bulb, which outputs measurement result as a change of voltage and electric resistance, and shown as a block diagram of circuit (FIG. 7) and as an example of circuitry (FIG. 8). Constituent components similar to those in FIG. 5 and FIG. 6 are denoted by the same reference numeral.

To describe briefly, in FIGS. 7 and 8, reference numeral 1 is an electric power source, 2 is a pulse generating circuit, 3 is an insulation transformer, 4 is a rectifying circuit, 6 is a current signal flowing in the primary coil of the insulation transformer 3, a broken line 7 indicates an insulation barrier between the plant side and instruction side, 25 is a resistance for measuring current, 26 is a condenser, 30 is a sensor which outputs a measurement result as a change in voltage or resistance like the thermocouple or resistance thermometer bulb which is a device-to-be-driven, 31 is a signal conversion circuit which consumes the voltage or resistance of the sensor, 32 is a transistor as a corresponding current, 33 is an amplifier, and 34, 35 and 36 is a resistance.

In the circuit shown in FIG. 7 and FIG. 8, the pulse generated in the pulse generating circuit 2 is increased in voltage, rectified by the rectifying circuit consisting of the diodes 21, 22 and condensers 23, 24 similarly as in the circuit of FIG. 6, then applied to a signal conversion circuit 31 consisting of a transistor 32, amplifier 33, resistances 34, 35 and 36.

The voltage or resistance of the sensor 30 like a thermocouple or resistance thermometer bulb is inputted to the signal conversion circuit 31 to be converted and amplified by the amplifier 33 into a voltage corresponding to the voltage or resistance of the sensor 30 to be applied to the base of the transistor 32, so a current corresponding to the voltage or resistance of the sensor 30 flows to the transistor 32. Therefore, a current corresponding to the current flows to the transistor 32 of the signal conversion circuit 31 flows in the primary coil of the insulation transformer 3. The voltage or resistance of the sensor 30 can be estimated by measuring the current 6 of the primary side flowing from the intermediate tap through the resistance 25 and condenser 26 by a current measuring means not shown in the drawing. Also, diagnosis can be performed whether there is breaking of wire or short-circuit in the circuit connected to the secondary winding by detecting whether there is abnormality in the primary side current 6 or not, that is, whether an excessively large current flows in the secondary side of the transformer 3 or absolutely no current flows.

Figure 9:
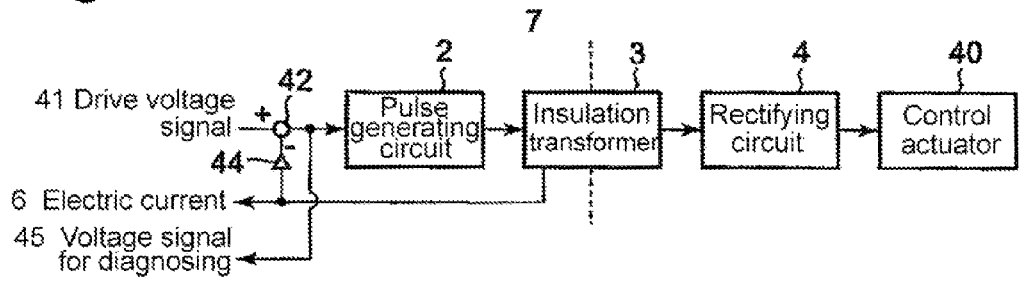
FIG. 9 is a block diagram of a circuit according to the invention for driving a control actuator such as a servo valve which controls valve opening from full open to full close in accordance with imputed voltage signals.
Figure 10:
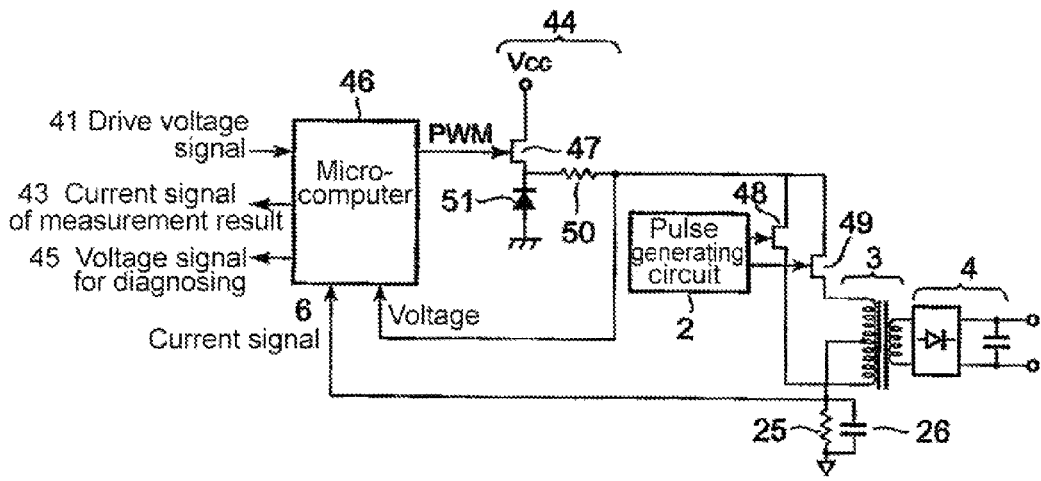
FIG. 10 is a diagram of a circuitry according to the invention for driving a control actuator such as a servo valve which controls valve opening from full open to full close in accordance with imputed voltage signals.

FIG. 9 and FIG. 10 correspond to the case of FIG. 20 and FIG. 24, i.e. in the case of the following item (3):

(3) In the case of a control actuator such as a servo valve which is supplied with electric power and controls valve opening from full open to full close in accordance with imputed voltage signals, and shown as a block diagram of circuit (FIG. 9) and as an example of circuitry (FIG. 10). Constituent components similar to those in FIG. 5 are denoted by the same reference numeral.

To describe briefly, in FIGS. 9 and 10, reference numeral 2 is a pulse generating circuit for generating a pulse signal of an amplitude corresponding to the voltage of a voltage signal 41 for driving a control actuator 40 (hereafter referred to as the object depending on circumstances), 3 is an insulation transformer, 4 is a rectifying circuit, 6 is a current signal flowing in the primary side of the insulation transformer 3, a broken line 7 indicates an insulation barrier. Reference numeral 25 and 26 is a resistance and a condenser for current measurement, 40 is a control actuator as an object as mentioned above, 41 is a drive voltage signal for driving the control actuator 40, 42 is an adder, 43 is a current signal of measurement result.

Reference numeral 44 is an amplifier which converts the current signal 6 as follows:

(a) when the control actuator is operating normally, converts it into 0 volt, and (b) when excessively large current flows or breaking of wire
or short-circuit occurs in the circuit, converts the primary side current 6 corresponding to the secondary side current of the insulation transformer into a voltage corresponding to the excessively large current or corresponding to the occurrence of breaking of wire or short-circuit.

Reference numeral 45 is a voltage signal for diagnosing whether a voltage corresponding to the drive voltage signal 41 is applied to the control actuator 40 or not, 46 is a control microcomputer for controlling the adder 42 and amplifier 44 in FIG. 9, 47 is a FET for sending a voltage corresponding to the voltage signal 41 to the insulation transformer 3, 48, 49 is a FET for alternately applying voltage to both ends of the primary winding of the insulation transformer 3, 50 is an inductor, and 51 is a diode.

First, the block diagram of FIG. 9 will be explained. The drive voltage signal 41 for driving the control actuator 40 applied to the pulse generating circuit 2 is a command signal to determine a current to be applied to the object, the control actuator 40, and send to the insulation transformer 3 as a pulse of amplitude corresponding to the voltage of the drive voltage signal for driving the object from the pulse generating circuit 2. A voltage corresponding to the drive voltage signal 41 is outputted from the insulation transformer 3, and rectified by the rectifying circuit 4 to drive the control actuator 40. A current corresponding to the rectified current flowing to the control actuator 40 flows to the primary side of the insulation transformer 3. This current signal 6 is converted by the amplifier 44 into voltage according to the cases (a) and (b) as described above to be sent to the adder 42. Resultant voltage is outputted as a voltage signal 45 of the insulation transformer 3. The voltage and current applied to the actuator 40 can be known by measuring the current signal 6 and voltage signal 45, and as a result the resistance of the actuator 40 can be known, so the presence or absence of abnormal operation of the actuator 40, breaking of wire, and short-circuit can be diagnosed.

Next, FIG. 10 which is a concrete circuitry of FIG. 9 which is a block diagram will be explained. The functions of the adder 42 and amplifier 44 in FIG. 9 are carried out by the control microcomputer 46, FEET 47, diode 51 and inductor 50.

The control microcomputer 46 allows to applies a PWM signal to the FET so that the applied drive voltage signal 41 of the control actuator 40 becomes a drive signal of the actuator 40 having a corresponding value, and a voltage corresponding to the drive voltage signal 41 is applied to the FET transistor 48, 49 to which a pulse is supplied from the pulse generator 2. Accordingly, the amplitude of the pulse from the pulse generating circuit 2 becomes a value which corresponds to the drive voltage signal 41, a voltage increased corresponding to the drive voltage signal 41 is outputted from the secondary side of the insulation transformer 3. This voltage is rectified by the rectifying circuit 4 and drive the control actuator 41.

Therefore, as a current corresponding to the current flowing the control actuator 40 flows to the primary side of the insulation transformer 3, the primary side current 6 which flows in the primary side from the intermediate tap of the insulation transformer 3 via the resistance 25 and condenser 26 is inputted to the control microcomputer 46, the primary side current 6 is converted as mentioned before depending on situations as follows:

(a) when the control actuator is operating normally, converted into 0 volt, and (b) when excessively large current flows or breaking of wire or short-circuit occurs in the circuit, converted into a voltage corresponding to the excessively large current or corresponding to the occurrence of breaking of wire or short-circuit. The converted value is added to the voltage applied to insulation transformer 3 from the inductor 50 via the FET 48, 49 to obtain the voltage signal 45.

As the voltage signal 45 and current signal 6 have respectively a voltage and current corresponding to the resistance of the control actuator 40, the voltage in the control actuator 40 can be known by measuring the voltage signal 45 and current signal 6. Therefore, whether the control actuator is 40 is working normally or not can be known by this measurement. When there occurs a short-circuit, the voltage signal is measures as a small voltage, and when there is breaking of wire, the voltage signal measured as a large voltage. It is suspected that there has occurred breaking of wire or short-circuit if excessive large voltage or excessive small voltage is measured. Therefore, a circuit can be composed provided which transmits the current or voltage flowing to the control actuator 40 to the instruction side with high accuracy without providing the modulating circuit 132, insulation transformer 133 for signal insulation, demodulating circuit 134, and signal conversion circuit 135.

Figure 11:
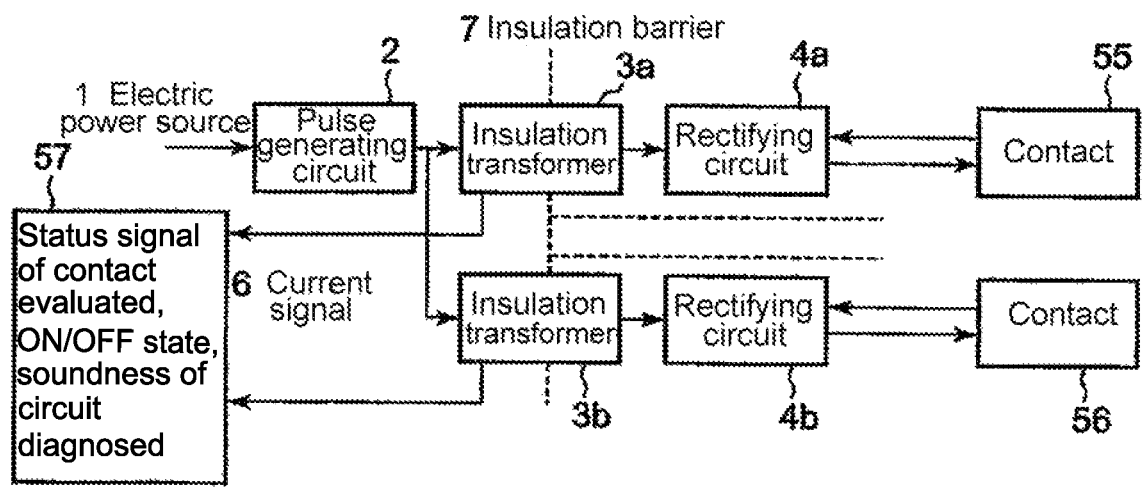
FIG. 11 is a block diagram of a circuit according to the invention for driving a control means having a contact for switching on and off upon detecting that pressure or temperature reaches a prescribed value utilized for detecting ambient conditions.
Figure 12A:
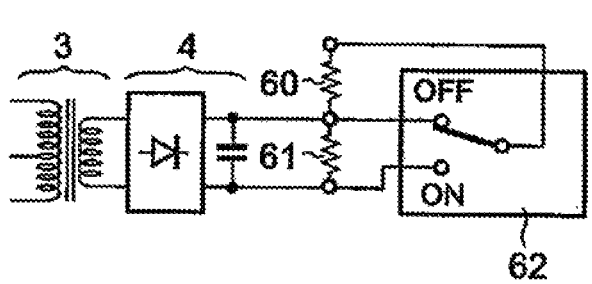
FIG. 12A is a diagram of a circuitry according to the invention for driving a control means having a contact for switching on and off upon detecting that pressure or temperature reaches a prescribed value utilized for detecting ambient conditions and FIG. 12B is a graph showing the range of the primary current of the transformer corresponding to the operating state of the control means.

FIG. 11 and FIG. 12 correspond to the case of FIG. 21 and FIG. 25, i.e. in the case of the following item (4):

(4) In the case of a control means having a contact for switching-on and -off upon detecting that pressure or temperature reaches a prescribed value and being utilized for detecting ambient conditions, the means being supplied with electric power, and shown as a block diagram of circuit (FIG. 11) and as an example of circuitry (FIG. 12A). Constituent components similar to those in FIG. 5 are denoted by the same reference numeral.

Figure 12B:
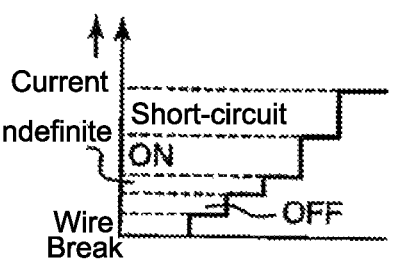

To describe briefly, in FIGS. 11 and 12A, reference numeral 1 is an electric power source, 2 is a pulse generating circuit, 3a, 3b is an insulation transformer, 4a, 4b is a rectifying circuit, and a broken line 7 indicates an insulation barrier, reference numeral 55, 56 is a control means such as a contact switching ON/OFF depending on pressure or temperature (hereafter referred to as the contact), 57 is a control microcomputer which evaluates condition of the contacts 55, 56 in an analog fashion based on the primary side current of the insulation transformer 3 and diagnoses the ON/OFF condition of the contacts, soundness of the circuit such as presence or absence of breaking of wire or short-circuit. The contact 55, 56 consists of a resistance 60, 61 and a contact 62 which is switched-on and -off depending on pressure or temperature, as shown in FIG. 12A as an example. FIG. 12B shows primary side current in the ordinate and the abscissa has no meaning, the vertical line to show current ranges are shifted horizontally only to make clear the boundaries of the ranges. In FIG. 12B, a region indicated by "short-circuit" is when there is a short-circuit, "ON" is when the contact 62 is in the state of ON, "OFF" is when the contact 62 is in the state of OFF, and "WIRE BREAK" is when there is breaking of wire.

The contact 62 as a control means switches to ON or OFF as shown in FIG. 12A depending on pressure or temperature, and when it is ON, both the resistances 60, 61 connect to the rectifying circuit 4, and when it is OFF, only the resistance 61 connects to the rectifying circuit 4. Therefore, the secondary side current changed in accordance with the ON/OFF of the contact 62, and primary side current of the insulation transformer 3 changes in accordance with the ON/OFF of the contact 62, so ON/OFF state of the contact 62 can be known by measuring the primary side current.

Further, even if the contact 62 is in OFF state, current flows via the resistance 61, so, as shown in FIG. 12B, the primary current becomes 0 when there is breaking of wire, becomes large when there is a short-circuit, and becomes a value between the "ON" and "OFF" of the contact 62 when there is a fault such as a fusion in apart of the contact.

Therefore, ON/OFF state of the contact 62, abnormal state such as breaking of wire, short-circuit, fusion of the contact can be diagnosed in the instruction side, by measuring the primary side current of the insulation transformer 3 and evaluating the measurement result by the control microcomputer 57. Moreover, the diagnosis can be performed with improved accuracy by providing an insulation transformer to each of the contacts while insulating the contacts from one another without need for additional provision of another parts and evading complication of the circuit, which results in manufacturing cost saving.

Figure 13:
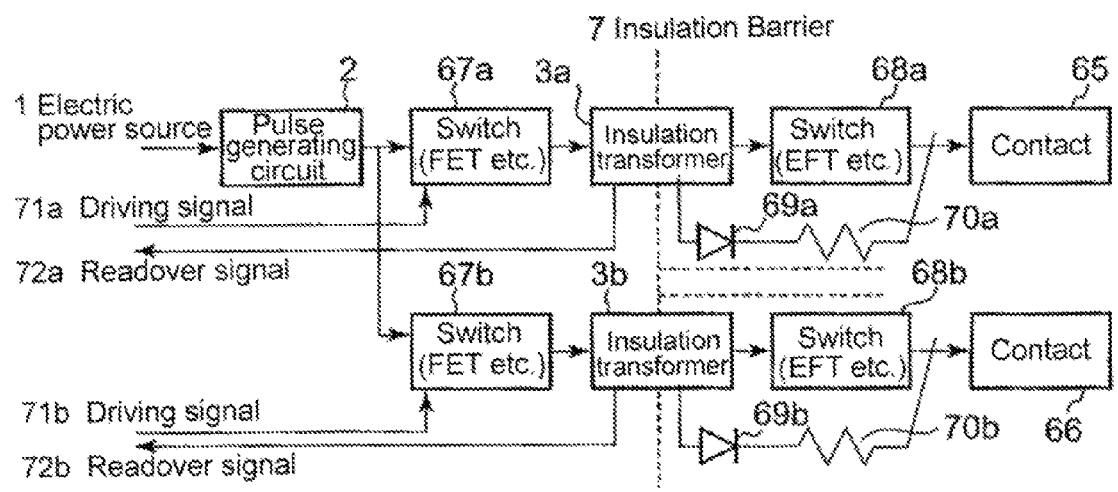
FIG. 13 is a block diagram of a circuit according to the invention for driving an outside control means such as a relay contact or ON/OFF switching means made of semiconductor, which actuates upon receiving an ON/OFF signal.
Figure 14:
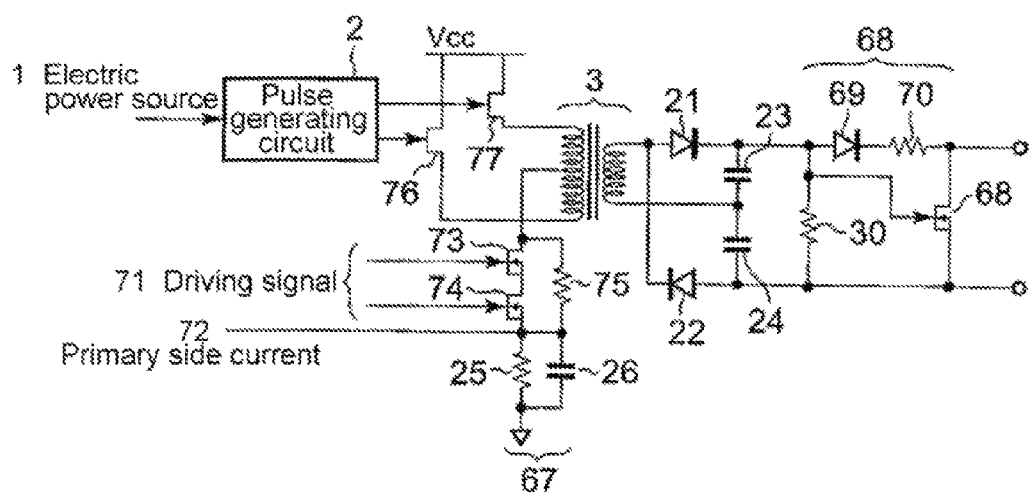
FIG. 14 is a diagram of a circuitry according to the invention for driving an outside control means such as a relay contact or ON/OFF switching means made of semiconductor, which actuates upon receiving an ON/OFF signal.

FIG. 13 and FIG. 14 correspond to the case of FIG. 22 and FIG. 26, i.e. in the case of the following item (5):

(5) In the case of a control means such as a relay contact or ON/OFF switching means made of semiconductor, which actuates upon receiving an ON/OFF signal, and shown as a block diagram of circuit (FIG. 13) and as an example of circuitry (FIG. 14). Constituent components similar to those in FIG. 5 and FIG. 6 are denoted by the same reference numeral.

To describe briefly, in FIGS. 13 and 14, reference numeral 1 is an electric power source, 2 is a pulse generating circuit, 3a, 3b is an insulation transformer, 4 is a rectifying circuit, and a broken line 7 indicates an insulation barrier. Reference numeral 25, 26 is a resistance and condenser respectively for measuring current, 65, 66 is a contact operated by an ON/OFF signal respectively, 67a, 67b, 68a, 68b is a switch circuit using a FET 68, 73, 74 in FIG. 14, 69a, 69b is a diode, 70a, 70b is a resistance, 71a, 71b is a drive signal for switching-on or -off the contact 65, 66 respectively, 72a, 72b is the primary side current of the insulation transformer 3a, 3b respectively, 73, 74 is a FET for applying to the secondary side of the insulation transformer 3 a voltage to allow the contacts 65, 66 to switch-on and a minute voltage to allow them to switch-off, 75 is a resistance, and 76, 77 is a FET for applying pulse of ON/OFF alternately to the both ends of the primary winding of the insulation transformer 3.

The contacts 65 and 66 are relay contacts or ON/OFF means composed of semiconductor material, and switched by the by the binary drive signals 71a, 71b respectively. The binary drive signals 71a, 71b are inputted to the switch circuit 67a, 67b using the FET 73, 74. Then the drive signal is imputed to the intermediate tap of the primary side of the insulation transformer 3 via the switch circuit 67a (67b). Here, the current applied to the primary side is varied according to whether it is applied via the two resistances 75 and 25 or only one resistance 25 such that, the secondary side voltage is varied to a voltage to switch-off the contact 65 (66) (that occurs when the current flows through the 25 only), and to a voltage to switch-off the contact 65 (66)(that occurs when the current flows through the two resistances 75 and 25). In this way, the voltage applied to the FET (68) composing the switch 68a, 68b is varied and ON/OFF of the contact 65 (66) is done.

The diode 69a, 69b, and resistance 70a, 70b are provided to apply a current for confirming whether the switch 68a, 68b is actually switched-on. When the contact 65 (66) is ON, that is, FET indicated by reference numeral 68 in FIG. 14 is ON, a current flows to the diodes 69a, 69b and resistances 70a, 70b, and when OFF, no current flows to them. This is detected by a change occurs in the primary side current 72 of the insulation transformer 3. In this way, whether the contact 65 (66) is actually switched-on and whether there is breaking of wire or short-circuit can be monitored.

Figure 15:
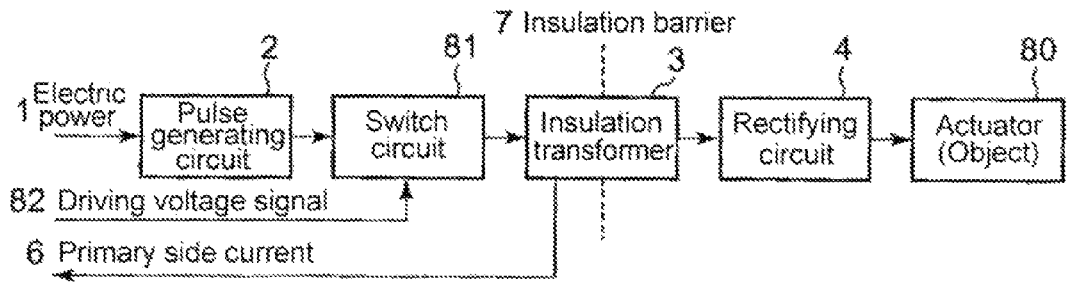
FIG. 15 is a block diagram of a circuit according to the invention for driving an actuator such as an electromagnetic valve, lamp, relay, small DC motor, etc., which is supplied or cut-off with electric power to drive it upon receiving an ON/OFF signal.
Figure 16:
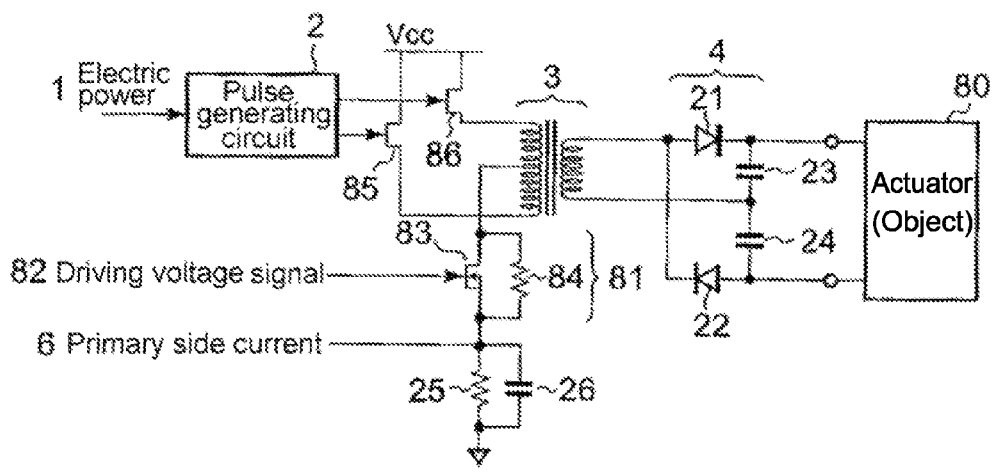
FIG. 16 is a diagram of a circuitry according to the invention for driving an actuator such as an electromagnetic valve, lamp, relay, small DC motor, etc., which is supplied or cut-off with electric power to drive it upon receiving an ON/OFF signal.
Figure 17:
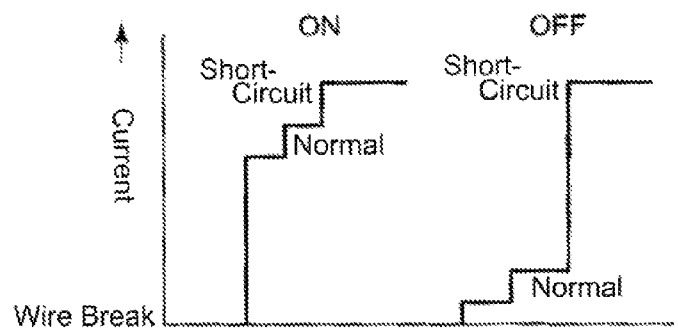
FIG. 17 is a graph showing current value in an actuator which is supplied or cut-off with electric power to drive it upon receiving an ON/OFF signal when the actuator operates normally, when breaking of wire has occurred, and when short-circuit has occurred.
Figure 23:
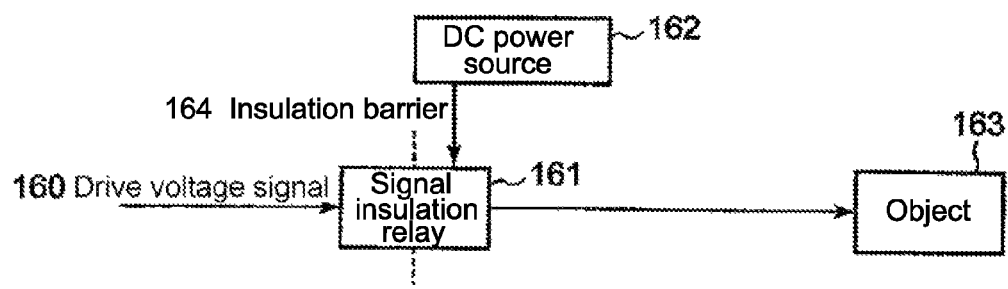
FIG. 23 is a block diagram of a conventional circuit for driving an object 163 which is an actuator such as an electromagnetic valve, lamp, relay, small DC motor, etc.
Figure 27:
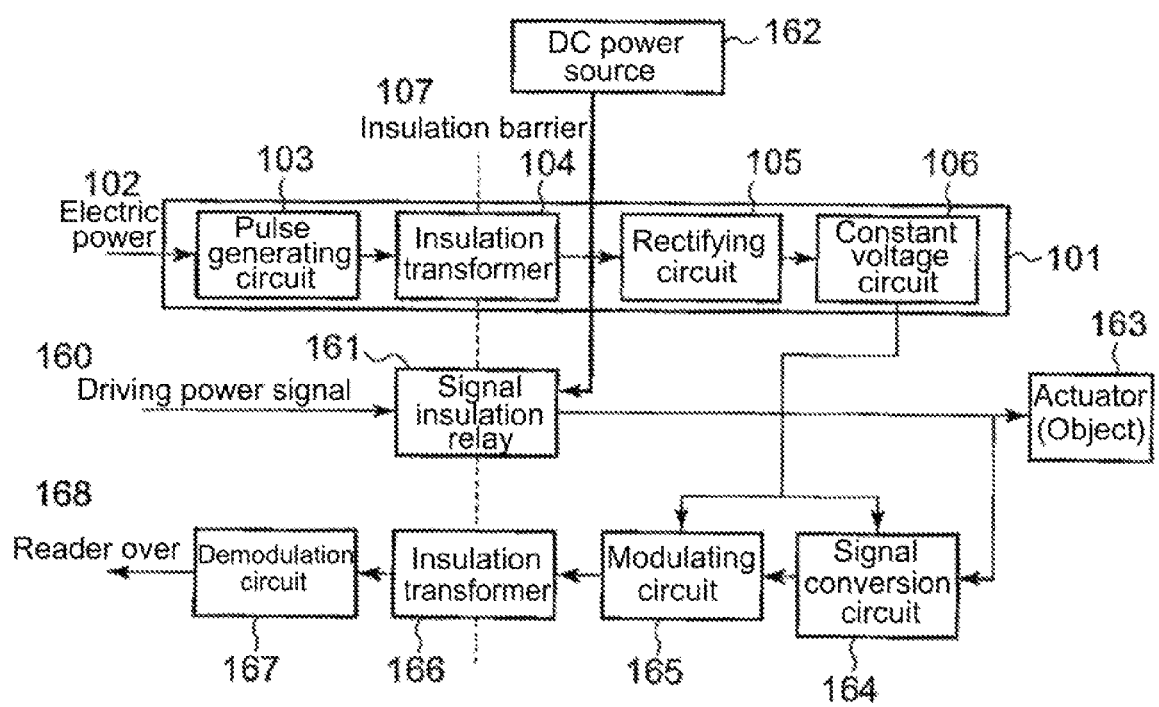
FIG. 27 is a block diagram of a conventional circuit provided with a circuit for performing diagnosis of signal status, for driving an actuator such as an electromagnetic valve which is fully opened or fully closed upon receiving voltage signal, or a servo valve of which opening is controlled between fully opened state and fully closed state in accordance with the voltage of a voltage signal.

FIG. 15, FIG. 16 and FIG. 17 correspond to the case of FIG. 23 and FIG. 27, i.e. in the case of the following item (6):

(6) In the case of a An actuator such as an electromagnetic valve, lamp, relay, small DC motor, etc., which is supplied or cut-off with electric power to be driven or stopped upon receiving an ON/OFF signal, and shown as a block diagram of circuit (FIG. 15) and as an example of circuitry (FIG. 16). FIG. 17 is a graph showing current value in an object 80, an actuator, when it operates normally, when breaking of wire has occurred, and when short-circuit has occurred. Constituent components similar to those in FIG. 5 and FIG. 6 are denoted by the same reference numeral.

To describe briefly, in FIGS. 15 and 16, reference numeral 1 is an electric power source, 2 is a pulse generating circuit, 3a, 3b is an insulation transformer, 4 is a rectifying circuit, and a broken line 7 indicates an insulation barrier. Reference numeral 80 is an actuator such as an electromagnetic valve, lamp, relay, small DC motor, etc. (hereafter referred to as the object depending on circumstances) supplied or cut-off with electric power upon receiving a binary signal, i.e. ON/OFF signal. Reference numeral 81 is a switch circuit comprising a FET 83, 82 is a drive voltage signal for driving the actuator 80, 83 is a FET for switched-on and -off by the drive voltage signal 82. Reference numeral 85, 86 is a FET for alternately applying a pulse signal to both ends of the primary winding of the insulation transformer 3, and 84 is a resistance.

In FIG. 17, a broken solid line in the left with a letter "ON" above it shows the value of the current signal 6 when the actuator 80 is in a state of ON, and a broken solid line in the right with a letter "OFF" above it shows the value of the current signal 6 when the actuator 80 is in a state of OFF. In the graph, range of current flows to the actuator 80 when it is operating normally is indicated by "NORMAL" in both cases of ON and OFF of the state of the actuator 80, that when there is breaking of wire is indicated by "WIRE BREAK", and that when there is a short-circuit is indicated "SHORT-CIRCUIT".

The actuator 80 in FIG. 15 and FIG. 16 is supplied with electric power of 10~20 W via the insulation transformer 3 and rectifying circuit 4 when the drive voltage signal 82 is in the state of ON, and with minute electric power insufficient to drive the actuator 80 when the drive voltage signal 82 is in the state of OFF. More specifically, the drive voltage signal 82 of ON/OFF switches-on/off the switch circuit 81 comprising the FET 83, and when the switch circuit 81 is in the stare of ON, the pulse applied to the primary winding of the insulation transformer 3 via the FET 85, 86 passes only the resistance 25, and when the switch circuit 81 is in the stare of OFF, the pulse applied to the primary winding of the insulation transformer 3 via the FET 85, 86 passes both resistances 84 and 25. Therefore, voltage of the power supply to the actuator 80 is high when the drive voltage signal 82 is in the state of ON, and low so that it is insufficient to drive the actuator 80 when the voltage signal 82 is in the state of OFF.

When the drive voltage signal 82 is ON, the actuator 80 is driven, a current flows to the secondary side of the insulation transformer 3. By this, a current corresponding to the drive current of the actuator 80 in the range indicated by "NORMAL" in the left broken solid line "ON" in FIG. 17 flows to the primary side of the insulation transformer 3.

When the drive voltage signal is OFF, a current corresponding to the drive current of the actuator 80, which is in fact not sufficient to drive the actuator 80, in the range indicated by "NORMAL" in the left broken solid line "ON" in FIG. 17 flows to the primary side of the insulation transformer 3.

Therefore, by measuring the primary side current 6 flowing from the intermediate tap via the resistance 25 and condenser 26 by a current measurement means not shown in the drawing, whether the actuator is working normally, whether there is breaking of wire or short-circuit, can be diagnosed in both cases of ON/OFF of the drive voltage signal 82.

INDUSTRIAL APPLICABILITY

According to the invention, provision of means for checking of the operation of a device-to-be-driven and soundness diagnosis of a circuit, which has been hesitated in the past because of increase in manufacturing cost, can be implemented with simple construction and without increase in the number of constituent elements, complication of the circuit configuration, and increase in manufacturing cost. The invention can be applied easily to electric circuits of high reliability.

The invention claimed is:

1. A device for diagnosing signal status, comprising:
a transformer comprising a primary coil and a secondary coil,
a signal generating means configured to generate an alternating voltage, the alternating voltage comprising a pulse voltage of an amplitude corresponding to an input voltage signal, connected to the primary coil of the transformer,
a device-to-be-driven for performing measurement, drive, or control connected to the secondary coil of the transformer,
a current measuring means for measuring change in the current of the primary coil caused by electric power consumed for an action of the device-to-be-driven, whereby diagnosis of signal status in the measurement, drive, or control by the device-to-be-driven is performed based on the measurement result of said change in current, and
an intermediate tap provided to the primary coil and configured to be connected to the current measuring means, wherein
the primary coil is divided into an anterior half and a posterior half, and the secondary coil is sandwiched by the anterior half and the posterior half of the primary coil, with the intermediate tap taken out from a center of the primary coil,
the device-to-be-driven is a control actuator which is powered by a drive voltage corresponding to the voltage of the input voltage signal inputted to the signal generating means,
the signal generating means is composed such that the drive voltage is generated in the secondary coil of the transformer receiving the alternating voltage signal, and
an adding means configured to convert a primary side current generated by the current consumed depending on operating condition, normal or abnormal, of the actuator, or presence or absence of breaking of wire or short-circuit, into a feedback voltage which is fed back and added to the input voltage signal,
whereby whether the actuator is operating normally or not and breaking of wire or short-circuit has occurred or not is diagnosed based on the feedback voltage by adding the converted voltage to the input voltage and the primary side current.

2. The device for diagnosing signal status according to claim 1, wherein said transformer comprises a core around which said primary and secondary coils are wound, and said core is composed of a material small in change of core loss by temperature change such that a linearity error of signal transmission between the primary and secondary coils is less than 0.1%.

* * * * *